(12) United States Patent
Hazeyama et al.

(10) Patent No.: US 7,119,438 B2
(45) Date of Patent: Oct. 10, 2006

(54) METHOD OF ARRANGING MICROSPHERES WITH LIQUID, MICROSPHERE ARRANGING DEVICE, AND SEMICONDUCTOR DEVICE

(75) Inventors: Ichiro Hazeyama, Tokyo (JP); Masahiro Kubo, Tokyo (JP); Sakae Kitajo, Tokyo (JP); Kazuhiko Futakami, Hamamatsu (JP); Shinichi Ishiduka, Hamamatsu (JP); Susumu Nanko, Hamamatsu (JP); Hitoshi Anma, Hamamatsu (JP); Tosiji Yamada, Hamamatsu (JP); Akeo Katahira, Hamamatsu (JP)

(73) Assignees: NEC Corporation, (JP); Japan E M Co., Ltd., (JP)

( * ) Notice: Subject to any disclaimer, the term of this patent is extended or adjusted under 35 U.S.C. 154(b) by 0 days.

(21) Appl. No.: 10/501,195

(22) PCT Filed: Jan. 10, 2003

(86) PCT No.: PCT/JP03/00148

§ 371 (c)(1),
(2), (4) Date: Aug. 25, 2004

(87) PCT Pub. No.: WO03/060987

PCT Pub. Date: Jul. 24, 2003

(65) Prior Publication Data

US 2005/0040528 A1 Feb. 24, 2005

(30) Foreign Application Priority Data

Jan. 10, 2002 (JP) .............................. 2002-003869
Feb. 18, 2002 (JP) .............................. 2002-040116
Jul. 15, 2002 (JP) .............................. 2002-206047

(51) Int. Cl.
*H01L 23/48* (2006.01)
*H01L 23/52* (2006.01)
*H01L 29/40* (2006.01)

(52) U.S. Cl. ...................... 257/738; 257/737; 257/690; 257/E23.021

(58) Field of Classification Search ................ 257/737, 257/738, 690, E23.021; 228/180.22, 179.1
See application file for complete search history.

(56) References Cited

U.S. PATENT DOCUMENTS

| 5,976,965 | A | 11/1999 | Takahashi et al. ........... 438/616 |
| 6,107,181 | A * | 8/2000 | Kitajima et al. ............. 438/616 |
| 2001/0009261 | A1* | 7/2001 | Yamamoto et al. ..... 228/180.22 |
| 2001/0015372 | A1* | 8/2001 | Yamamoto et al. ..... 228/180.22 |

FOREIGN PATENT DOCUMENTS

| JP | 11-008272 | 1/1999 |
| JP | 2000-294676 | 10/2000 |
| JP | 2001-210942 | 8/2001 |
| JP | 2001-223232 | 8/2001 |

* cited by examiner

*Primary Examiner*—Nitin Parekh
(74) *Attorney, Agent, or Firm*—Hayes Soloway P.C.

(57) ABSTRACT

A method of arranging microspheres with liquid, a microsphere arranging device, and a semiconductor device are provided. The method comprising the steps of placing the semiconductor device with a large number of pads with holes, on a loading table with a variable tilt angle, and pouring microspheres together with conductive liquid held in a holding container onto the semiconductor device. The microspheres are storably placed in the holes on the pads of the semiconductor device. The non-stored microspheres and conductive liquid are accumulated in a receiving tank, and the conductive liquid including the accumulated microspheres are transferred to the holding container by a pump.

12 Claims, 26 Drawing Sheets

SUCTION → ← DISCHARGE

METHOD OF ARRANGING MICROSPHERES WITH LIQUID, MICROSPHERE ARRANGING DEVICE, AND SEMICONDUCTOR DEVICE

TECHNICAL FIELD

This invention relates to the arrangement of a microsphere such as a solder bump in a bump electrode forming process for BGA (ball grid array), CSP (chip size package) and flip-chip bonding etc., and relates particularly to a method of arranging microspheres with liquid, a microsphere arranging apparatus and a semiconductor device.

BACKGROUND ART

Japanese patent application laid-open No. 5-129374 discloses a method of making an electrode bump such that a microsphere is mounted on a bump forming member. After mounting the microsphere, the microsphere is fused. In this method, microspheres are adsorbed into holes that are provided in the same arrangement as that of the bump forming member, and then they are transferred onto the semiconductor chip or circuit board. Examples of bump forming members are semiconductor chips (semiconductor devices) and circuit boards and solder balls are examples of a microspheres.

An adsorption head is provided that has adsorption holes for microspheres in the same arrangement as that of the bump forming member. The adsorption head is moved to the bump forming member while holding the microspheres in the adsorption holes. Then, by releasing the microspheres, the microspheres are transferred to the bump forming member.

In this case, it is necessary to adsorb the microspheres onto the adsorption head in the correct proportion. However, since the microspheres are laid at random, it is difficult to adsorb them at predetermined positions when a vacuum is used to adsorb the microspheres. Therefore, a microsphere arrangement pallet is prepared such that microspheres are disposed in advance in the same arrangement as that of electrode bumps. By vacuuming the microspheres on the pallet, they can be adsorbed in correct proportion to the adsorption head.

However, it is difficult to stably arrange microspheres on the microsphere arrangement pallet in atmosphere. Due to static electricity or moisture, the microspheres may be adhered to each other or be adsorbed upon the surface of arrangement pallet.

Japanese patent application laid-open No. 11-8272 discloses a method that an arrangement pallet is soaked in conductive liquid and then microspheres are dropped on the arrangement pallet, secured in respective arrangement holes, thereby removing the influence of static electricity or moisture.

In the above in-solution arrangement method, where micro-metal balls (microspheres) are arranged in conductive liquid, a stable arrangement operation can be conducted because of removing the influence of static electricity or moisture. However, since it uses ethanol, which is highly volatile, it is necessary to supplement evaporated portion so as to stabilize the operation. Thus, a large amount of ethanol is needed. Further, in transferring the arrangement pallet to the next step, it is difficult to remove the pallet from the conductive liquid. Thus, it is difficult to automate the taking-out step.

Japanese patent application laid-open No. 2001-210942 discloses a method where another closed vessel is prepared, other than a closed vessel that used when the arrangement operation is conducted, while soaking the arrangement pallet. The vessels are then connected through a flexible tube. The conductive liquid and micro-metal balls are transferred between the vessels using the gravity difference of the vessels.

In this method, the evaporation of conductive liquid can be prevented by using the closed vessel, and the usability of employed material can be improved by using repeatedly the conductive liquid and micro-metal balls. Furthermore, the operation can be facilitated such that, after completing the arrangement operation on the arrangement pallet, the conductive liquid and micro-metal balls in the arrangement pallet soaking vessel are evacuated while being transferred to the other vessel, and then the arrangement pallet is taken out from the one closed vessel.

Subsequently, the microspheres are secured in the arrangement holes and then adsorbed by the adsorption head of a vacuum apparatus. The adsorption head has a plane with air holes provided therein corresponding to the arrangement holes. The adsorption is conducted such that the adsorption head is in contact with the arrangement-holes forming surface of arrangement pallet, and then the microspheres are adsorbed to the air holes under vacuum. After adsorption, the microspheres on the adsorption head are aligned with the pad position of semiconductor wafer, and then by cutting off the vacuum the microspheres are dropped on the pads to mount them there.

However, in the conventional method of mounting the microspheres on the bump forming member of semiconductor device by using the arrangement pallet, there are some problems described below.

Since the process needs to be conducted such that the microspheres are accommodated in the holes (arrangement holes) in the arrangement pallet and then transferred onto the pads of semiconductor device, the number of steps in the bump electrode forming process must be increased. The manufacturing cost will also be increased. Further, the entire composition of bump electrode forming process is quite complicated.

Further, in recovering the conductive liquid and excess microspheres to reuse them, the microsphere may be deformed, crushed or defaced due to hitting the corner of vessel or being trapped in the gaps of vessel. In this case, the microsphere may not be accommodated in the arrangement hole or may not be adsorbed by the adsorption head even when accommodated. Thus, the microsphere cannot be transferred to the semiconductor device. Furthermore, although the conductive liquid and microspheres can be recovered by tilting or reversing the vessel, a small amount of them may be left in the vessel. Thus, they are wasted to some degree.

Further, in adsorbing the microsphere into the adsorption head, the surface of adsorption head needs to be in close contact with the arrangement holes forming surface of the arrangement pallet. Therefore, high processing accuracy is needed to flatten both surfaces. Further, if the step of adsorbing the microsphere to the adsorption head is conducted in atmosphere, the neighboring microspheres attract each other, thereby failing to be adsorbed. As a result, the manufacturing cost in the bump electrode forming process is increased.

Still further, in order to enhance the operating efficiency, a process of accommodating microspheres in another arrangement pallet needs to be conducted during the adsorption. Therefore, multiple arrangement pallets are needed and the operating cost is increased.

The invention is devised in view of the above problems, and it is intended to provide a method of arranging a microsphere by means of liquid, microsphere arranging apparatus and semiconductor device such that the manufacturing cost in the bump electrode forming process can be reduced, the entire composition of the process can be simplified, and the conductive liquid and microspheres can be recycled without being wasted.

SUMMARY OF INVENTION

In order to solve the above problems, according to the invention, a method of arranging microspheres with liquid comprises the steps of:

providing a semiconductor device that includes a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere; and pouring the microsphere into the hole together with conductive liquid to mount the microsphere on the pad.

The process of pouring the microsphere into the hole of the semiconductor device together with conductive liquid may be conducted in the air.

The process of pouring the microsphere into the hole of the semiconductor device together with conductive liquid may be conducted in the liquid.

The semiconductor device may be kept horizontal when pouring the microsphere into the hole of the semiconductor device together with conductive liquid.

The semiconductor device may be kept inclined when pouring the microsphere into the hole of the semiconductor device together with conductive liquid.

The microsphere may be transported together with the conductive liquid.

Further, according to the invention, a method of arranging microspheres with liquid comprises the steps of:

providing a semiconductor device that includes a semiconductor wafer with a predetermined semiconductor element and an interconnection and with a number of pads connected the interconnection and attached on a surface of the semiconductor wafer, and a mask with a penetrating hole formed at the respective pad positions to mount the microsphere, the mask being held on the semiconductor device to allow the hole to be disposed on the pad; and pouring the microsphere into the hole together with conductive liquid to mount the microsphere on the pad.

The process of pouring the microsphere into the hole of the mask together with conductive liquid may be conducted in the air.

The process of pouring the microsphere into the hole of the mask together with conductive liquid may be conducted in the liquid.

The semiconductor device may be kept horizontal when pouring the microsphere into the hole of the mask together with conductive liquid.

The semiconductor device may be kept inclined when pouring the microsphere into the hole of the mask together with conductive liquid.

The microsphere may be transported together with the conductive liquid.

Further, according to the invention, a microsphere arranging apparatus comprises:

a mounting means for mounting a semiconductor device that includes a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere;

a storing means for storing conductive liquid containing a number of microspheres and for supplying the microsphere together with the stored conductive liquid to the semiconductor device mounted on the mounting means; and a retaining means for retaining the conductive liquid containing the microsphere supplied from the storing means to the semiconductor device.

Further, according to the invention, a microsphere arranging apparatus comprises:

a mounting means for mounting a semiconductor device that includes a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere;

a storing means for storing conductive liquid containing a number of microspheres and for supplying the microsphere together with the stored conductive liquid to the semiconductor device mounted on the mounting means;

a retaining means for retaining the conductive liquid containing the microsphere supplied from the storing means to the semiconductor device;

a tube that connects between the storing means and the retaining means; and a pump means that is built in the tube to transport the conductive liquid containing the microsphere being retained in the retaining means to the storing means.

Further, according to the invention, a microsphere arranging apparatus comprises:

a mounting means for mounting a semiconductor device that includes a semiconductor wafer with a predetermined semiconductor element and an interconnection and with a number of pads connected the interconnection and attached on a surface of the semiconductor wafer, and for holding a mask with a penetrating hole formed at the respective pad positions to mount the microsphere so as to allow the hole to be disposed on the pad;

a storing means for storing conductive liquid containing a number of microspheres and for supplying the microsphere together with the stored conductive liquid through the mask to the semiconductor device mounted on the mounting means; and a retaining means for retaining the conductive liquid containing the microsphere supplied from the storing means to the semiconductor device.

Further, according to the invention, a microsphere arranging apparatus comprises:

a mounting means for mounting a semiconductor device that includes a semiconductor wafer with a predetermined semiconductor element and an interconnection and with a number of pads connected the interconnection and attached on a surface of the semiconductor wafer, and for holding a mask with a penetrating hole formed at the respective pad positions to mount the microsphere so as to allow the hole to be disposed on the pad;

a storing means for storing conductive liquid containing a number of microspheres and for supplying the microsphere together with the stored conductive liquid through the mask to the semiconductor device mounted on the mounting means;

a retaining means for retaining the conductive liquid containing the microsphere supplied from the storing means to the semiconductor device;

a tube that connects between the storing means and the retaining means; and a pump means that is built in the tube to transport the conductive liquid containing the microsphere being retained in the retaining means to the storing means.

The pump means may comprise a base, a rotating means to rotate, and a plurality of rollers that are rotatably attached to the circumference of the rotating means; the tube is a flexible tube disposed between the roller and the base; and a clearance between the roller and the tube disposed is provided so as to have a gap that allows the microsphere contained in the conductive liquid to pass through inside the tube while having its original shape when the tube is pressed by the rotation of the roller.

The storing means may have a first ejection tube that ejects, in an arbitrary direction, the microsphere together with the stored conductive liquid.

The storing means may have a second ejection tube that ejects, in an arbitrary direction, the microsphere together with the stored conductive liquid.

A moving means may be provided that allows the mounting means to move into the retaining means.

An oscillating means may be provided that applies oscillation to the mounting means.

The oscillating means may have a mechanism that applies horizontal oscillation to the semiconductor device.

The oscillating means may have a mechanism that applies unidirectional shock to the semiconductor device.

Further, according to the invention, a microsphere arranging apparatus comprises:

a mounting means for mounting a semiconductor device that includes a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere;

a storing means for storing conductive liquid containing a number of microspheres and for supplying the microsphere together with the stored conductive liquid to the semiconductor device mounted on the mounting means;

a retaining means for retaining the conductive liquid containing the microsphere supplied from the storing means to the semiconductor device;

a tube that connects between the storing means and the retaining means; and a vertical movement means that allows the storing means to move to a position above or below the retaining means.

Further, according to the invention, a microsphere arranging apparatus comprises:

a mounting means for mounting a semiconductor device that includes a semiconductor wafer with a predetermined semiconductor element and an interconnection and with a number of pads connected the interconnection and attached on a surface of the semiconductor wafer, and for holding a mask with a penetrating hole formed at the respective pad positions to mount the microsphere so as to allow the hole to be disposed on the pad;

a storing means for storing conductive liquid containing a number of microspheres and for supplying the microsphere together with the stored conductive liquid through the mask to the semiconductor device mounted on the mounting means;

a retaining means for retaining the conductive liquid containing the microsphere supplied from the storing means to the semiconductor device;

a tube that connects between the storing means and the retaining means; and a vertical movement means that allows the storing means to move to a position above or below the retaining means.

A moving means may be provided that allows the mounting means to move into the retaining means.

An oscillating means may be provided that applies oscillation to the mounting means.

The oscillating means may have a mechanism that applies horizontal oscillation to the semiconductor device.

The oscillating means may have a mechanism that applies unidirectional shock to the semiconductor device.

The storing means may have a first ejection tube that ejects, in an arbitrary direction, the microsphere together with the stored conductive liquid.

The storing means may have a second ejection tube that ejects, in an arbitrary direction, the microsphere together with the stored conductive liquid.

An adjusting means may be provided that defines, between the semiconductor device and the mask, a gap that prevents the gas or conductive liquid from being retained in the hole when accommodating the microsphere into the mask hole together with the conductive liquid.

A relief groove may be provided, in connection with the hole, that releases the gas or conductive liquid so as not retain it in the hole when accommodating the microsphere into the mask hole together with the conductive liquid.

The groove may be, without penetrating through the mask, provided on at least one of the mask surface on the semiconductor wafer side or the mask surface on the opposite side to the semiconductor wafer side.

The mask may have a thickness that allows the microsphere to be retained in the hole and prevents the two or more microspheres from being entered therein.

A minimum diameter of the hole to be generated due to a manufacture accuracy of the mask hole may be made to be greater than a value obtained by adding a gap to a maximum diameter of the microsphere, and a maximum diameter of the hole may be made to prevent the two or more microspheres from being entered into the one hole and prevent the microsphere from being released from the pad.

The mask hole may be formed rectangular.

The mask hole may be formed tapered such that the semiconductor wafer side is wider than the resist surface side.

Further, according to the invention, a semiconductor device comprises:

a semiconductor wafer with a predetermined semiconductor element and an interconnection and with a number of pads connected the interconnection and attached on a surface of the semiconductor wafer; and a resist formed on the semiconductor wafer and having a penetrating hole formed at the respective pad positions to mount the microsphere, wherein the resist has a thickness that allows the microsphere to be retained in the hole and prevents the two or more microspheres from being entered therein.

Further, according to the invention, a semiconductor device comprises:

a semiconductor wafer with a predetermined semiconductor element and an interconnection and with a number of pads connected the interconnection and attached on a surface of the semiconductor wafer; and a resist formed on the semiconductor wafer and having a penetrating hole formed at the respective pad positions to mount the microsphere, wherein a minimum diameter of the hole to be generated due to a manufacture accuracy of the hole is made to be greater than a value obtained by adding a gap to a maximum diameter of the microsphere, and a maximum diameter of the hole is made to prevent the two or more microspheres from being entered into the one hole and prevent the microsphere from being released from the pad.

Further, according to the invention, a semiconductor device comprises:

a semiconductor wafer with a predetermined semiconductor element and an interconnection and with a number of pads connected the interconnection and attached on a surface of the semiconductor wafer; and a resist formed on the semiconductor wafer and having a penetrating hole formed at the respective pad positions to mount the microsphere, wherein the resist has a thickness that allows the microsphere to be retained in the hole and prevents the two or more microspheres from being entered therein, a minimum diameter of the hole to be generated due to a manufacture accuracy of the hole is made to be greater than a value obtained by adding a gap to a maximum diameter of the microsphere, and a maximum diameter of the hole is made to prevent the two or more microspheres from being entered into the one hole and prevent the microsphere from being released from the pad.

A relief groove may be provided, in connection with the hole, that releases the gas or conductive liquid so as not retain it in the hole when accommodating the microsphere into the mask hole together with the conductive liquid.

Further, according to the invention, a semiconductor device comprises:

a semiconductor wafer with a predetermined semiconductor element and an interconnection and with a number of pads connected the interconnection and attached on a surface of the semiconductor wafer; and a resist formed on the semiconductor wafer and having a penetrating hole formed at the respective pad positions to mount the microsphere, wherein the resist has a thickness that allows a plurality of the microspheres to be accommodated in the hole.

Further, according to the invention, a semiconductor device comprises:

a semiconductor wafer with a predetermined semiconductor element and an interconnection and with a number of pads connected the interconnection and attached on a surface of the semiconductor wafer; and a resist formed on the semiconductor wafer and having a penetrating hole formed at the respective pad positions to mount the microsphere, wherein the hole is formed tapered such that the semiconductor wafer side is wider than the resist surface side.

Further, according to the invention, a semiconductor device comprises:

a semiconductor wafer with a pad formed in a predetermined pattern on its surface;

a resist formed on the semiconductor wafer and having a hole formed in the predetermined pattern at a corresponding position to the pad; and a microsphere accommodated in the hole, wherein the hole is provided with a relief means to release a conductive liquid and a gas left in the hole outside the hole when the microsphere is supplied together with the conductive liquid.

The resist hole may be formed rectangular.

Further, according to the invention, a method of arranging microspheres with liquid comprises the steps of:

providing a semiconductor device that includes a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere; and pouring the microsphere into the hole together with conductive liquid while rotating the semiconductor device to mount the microsphere on the pad.

The semiconductor device may be kept inclined and the microsphere may be poured together with conductive liquid to the upper portion of the semiconductor wafer being kept inclined and rotated.

The semiconductor device may be kept horizontal and the microsphere may be poured together with conductive liquid to the center portion of the semiconductor wafer being kept horizontal and rotated.

The process of pouring the microsphere into the hole of the semiconductor device together with conductive liquid may be conducted in the air.

The process of pouring the microsphere into the hole of the semiconductor device together with conductive liquid may be conducted in the liquid.

The microsphere may be transported together with the conductive liquid.

Further, according to the invention, a method of arranging microspheres with liquid comprises the steps of:

providing a semiconductor device that includes a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere;

disposing the semiconductor device to be inclined; and pouring the microsphere into the hole together with conductive liquid while oscillating an ejection means for ejecting the microsphere together with the conductive liquid between one end to the other end of the semiconductor device over the inclined semiconductor device so as to mount the microsphere on the pad.

The process of pouring the microsphere into the hole of the semiconductor device together with conductive liquid may be conducted in the air.

The process of pouring the microsphere into the hole of the semiconductor device together with conductive liquid may be conducted in the liquid.

The microsphere may be transported together with the conductive liquid.

Further, according to the invention, a method of arranging microspheres with liquid comprises the steps of:

providing a semiconductor device that includes a semiconductor wafer with a predetermined semiconductor element and an interconnection and with a number of pads connected the interconnection and attached on a surface of the semiconductor wafer, and a mask with a penetrating hole formed at the respective pad positions to mount the microsphere, the mask being held on the semiconductor device to allow the hole to be disposed on the pad; and pouring the microsphere into the hole together with conductive liquid while rotating the semiconductor device to mount the microsphere on the pad.

Further, according to the invention, a method of arranging microspheres with liquid comprises the steps of:

providing a semiconductor device that includes a semiconductor wafer with a predetermined semiconductor element and an interconnection and with a number of pads connected the interconnection and attached on a surface of the semiconductor wafer, and a mask with a penetrating hole formed at the respective pad positions to mount the microsphere, the mask being held on the semiconductor device to allow the hole to be disposed on the pad;

disposing the semiconductor device to be inclined; and pouring the microsphere into the hole together with conductive liquid while oscillating an ejection means for ejecting the microsphere together with the conductive liquid between one end to the other end of the semiconductor device over the inclined semiconductor device so as to mount the microsphere on the pad.

Further, according to the invention, a microsphere arranging apparatus comprises:

a mounting-rotating means for mounting a semiconductor device and for rotating the semiconductor device mounted, the semiconductor device including a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere;

a storing means for storing conductive liquid containing a number of microspheres and for supplying the microsphere together with the stored conductive liquid to the semiconductor device mounted on the mounting-rotating means; and a retaining means for retaining the conductive liquid containing the microsphere supplied from the storing means to the semiconductor device.

The storing means may have a first ejection tube that ejects in an arbitrary direction the microsphere together with the stored conductive liquid, and the mounting-rotating means may have a first mount base that mounts the semiconductor device being kept inclined, the microsphere being poured together with the conductive liquid from the first ejection tube to the upper portion of the semiconductor device being kept inclined and rotated while being mounted on the first mount base.

The storing means may have a second ejection tube that ejects only the stored conductive liquid in an arbitrary, the microsphere being poured together with the conductive liquid from the second ejection tube to the upper portion of the semiconductor device being kept inclined and rotated while being mounted on the first mount base.

The storing means may have a first ejection tube that ejects in an arbitrary direction the microsphere together with the stored conductive liquid, and the mounting-rotating means may have a second mount base that mounts the semiconductor device being kept horizontal, the microsphere being poured together with the conductive liquid from the first ejection tube to the center portion of the semiconductor device being kept horizontal and rotated while being mounted on the second mount base.

The storing means may have a second ejection tube that ejects only the stored conductive liquid in an arbitrary, the microsphere being poured together with the conductive liquid from the second ejection tube to the center portion of the semiconductor device being kept horizontal and rotated while being mounted on the second mount base.

The mounting-rotating means may be disposed above or in the retaining means.

An oscillating means may be provided that applies oscillation to the mounting-rotating means.

A tube may be provided that connects between the storing means and the retaining means; and a pump means may be provided that is built in the tube to transport the conductive liquid containing the microsphere being retained in the retaining means to the storing means.

Further, according to the invention, a microsphere arranging apparatus comprises:

a mounting means for mounting a semiconductor device while disposing the semiconductor device to be inclined, the semiconductor device including a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere;

a storing means for storing conductive liquid containing a number of microspheres;

a first ejection tube for ejecting the microsphere together with the conductive liquid;

an oscillating means for oscillating the first ejection tube between one end to the other end of the semiconductor device over the semiconductor device inclined; and a retaining means for retaining the conductive liquid containing the microsphere ejected from the first ejection tube to the semiconductor device.

A second ejection tube may be provided that ejects only the conductive liquid in the storing means, and the oscillating means may oscillate the second ejection tube as well.

The mounting means may be disposed above or in the retaining means.

An oscillating means may be provided that applies oscillation to the mounting means.

A tube may be provided that connects between the storing means and the retaining means; and a pump means may be provided that is built in the tube to transport the conductive liquid containing the microsphere being retained in the retaining means to the storing means.

Further, according to the invention, a microsphere arranging apparatus comprises:

a mounting-rotating means for mounting a semiconductor device and for rotating the semiconductor device mounted, the semiconductor device including a semiconductor wafer with a predetermined semiconductor element and an interconnection and with a number of pads connected the interconnection and attached on a surface of the semiconductor wafer, and for holding a mask with a penetrating hole formed at the respective pad positions to mount the microsphere so as to allow the hole to be disposed on the pad;

a storing means for storing conductive liquid containing a number of microspheres and for supplying the microsphere together with the stored conductive liquid to the pad on the semiconductor device mounted on the mounting-rotating means; and a retaining means for retaining the conductive liquid containing the microsphere supplied from the storing means to the pad.

Further, according to the invention, a microsphere arranging apparatus comprises:

a mounting means for mounting a semiconductor device while disposing the semiconductor device to be inclined, the semiconductor device including a semiconductor wafer with a predetermined semiconductor element and an interconnection and with a number of pads connected the interconnection and attached on a surface of the semiconductor wafer, and for holding a mask with a penetrating hole formed at the respective pad positions to mount the microsphere so as to allow the hole to be disposed on the pad;

a storing means for storing conductive liquid containing a number of microspheres;

a first ejection tube for ejecting the microsphere together with the conductive liquid;

an oscillating means for oscillating the first ejection tube between one end to the other end of the semiconductor device over the pad of the semiconductor device; and a retaining means for retaining the conductive liquid containing the microsphere ejected from the first ejection tube to the pad.

Further, according to the invention, a microsphere arranging apparatus comprises:

a mounting-rotating means for mounting a semiconductor device and for rotating the semiconductor device mounted, the semiconductor device including a semiconductor wafer with a predetermined semiconductor element and an interconnection and with a number of pads connected the interconnection and attached on a surface of the semiconductor wafer, and for holding a mask with a penetrating hole formed at the respective pad positions to mount the microsphere so as to allow the hole to be disposed on the pad;

a storing means for storing conductive liquid containing a number of microspheres and for supplying the microsphere together with the stored conductive liquid to the pad on the semiconductor device mounted on the mounting-rotating means;

a retaining means for retaining the conductive liquid containing the microsphere supplied from the storing means to the pad;

a tube that connects between the storing means and the retaining means; and a vertical movement means that allows the storing means to move to a position above or below the retaining means.

DETAILED DESCRIPTION OF THE INVENTION

The embodiments of the invention will be explained below with reference to the drawings.

Figure 1:
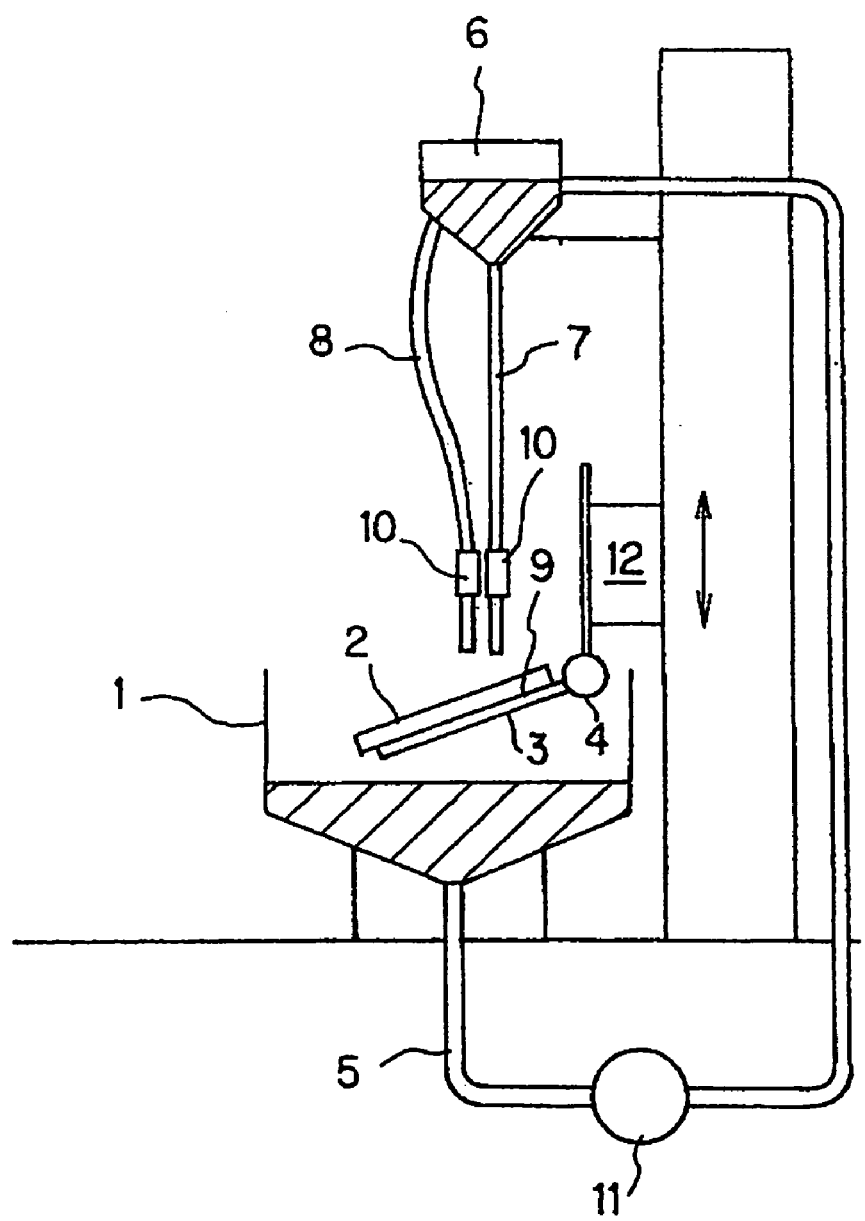
FIG. 1 shows the composition of a microsphere arranging apparatus in a first preferred embodiment of the invention.

FIG. 1 shows the composition of a microsphere arranging apparatus in the first preferred embodiment of the invention.

The microsphere arranging apparatus as shown in FIG. 1 is, for example, applied to a bump electrode forming process of semiconductor device. Namely, the bump electrode forming process is completed such that, after forming a resist on a semiconductor wafer, exposure, development, transferring solder balls to holes on the semiconductor wafer, reflowing of solder balls and removing of resist is conducted. The microsphere arranging apparatus of the invention is applied to a step of transferring solder balls to holes on the semiconductor wafer.

Figure 4:
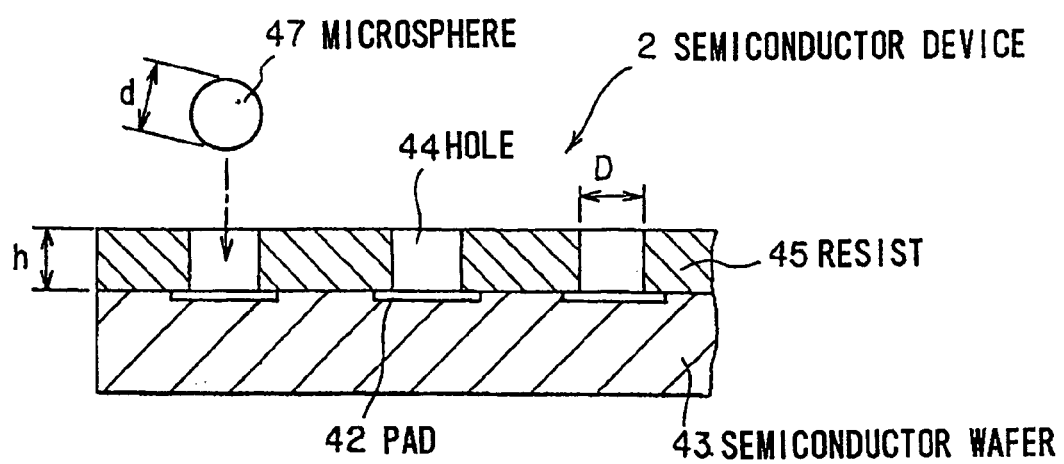
FIG. 4 is a cross sectional view showing the composition of a semiconductor device mounted on the mount base of microsphere arranging apparatus.

The microsphere arranging apparatus in FIG. 1 is provided with a transfer bath 1, that is, a container containing an accommodating conductive liquid. A mount base 3 to mount a semiconductor device 2 as detailed later in FIG. 4 is disposed nearly at the center thereof.

The mount base 3 is composed such that its height in the vertical direction can be changed by a mount base shifter 12. Further, its angle can be freely varied horizontally or vertically by a supporting portion 4. The mount base 3 is attached to the mount base shifter 12.

The transfer bath 1 has a bottom face to which one opening of a flexible circulation pipe 5 is connected. The other opening of the circulation pipe 5 is connected to the side face of a storage container 6. It is desirable that the bottom face of transfer bath 1 has a structure to facilitate the flowing of microspheres 47 as shown in FIG. 4 and conductive liquid into the circulation pipe 5. For example, as shown in FIG. 1, the bottom of transfer bath 1 is shaped like a funnel to facilitate the flowing of microspheres 47 and conductive liquid into the circulation pipe 5.

The storage container 6 is connected through the circulation pipe 5 with the transfer bath 1, and it is connected with a washing pipe 8 at its side face and with an ejection pipe 7 at its bottom. Further, the storage container 6 is structured such that the system except for the pipe-connected portion is closed to prevent the evaporation of volatile conductive liquid as much as possible.

It is desirable that the bottom face of storage container 6 has a structure to facilitate the flowing of microspheres 47 and conductive liquid into the ejection pipe 7 so as to prevent the deformation of microspheres 47. For example, the ejection pipe is shaped like a funnel to facilitate the flowing of microspheres 47 and conductive liquid into the ejection pipe 7.

Figure 2A:
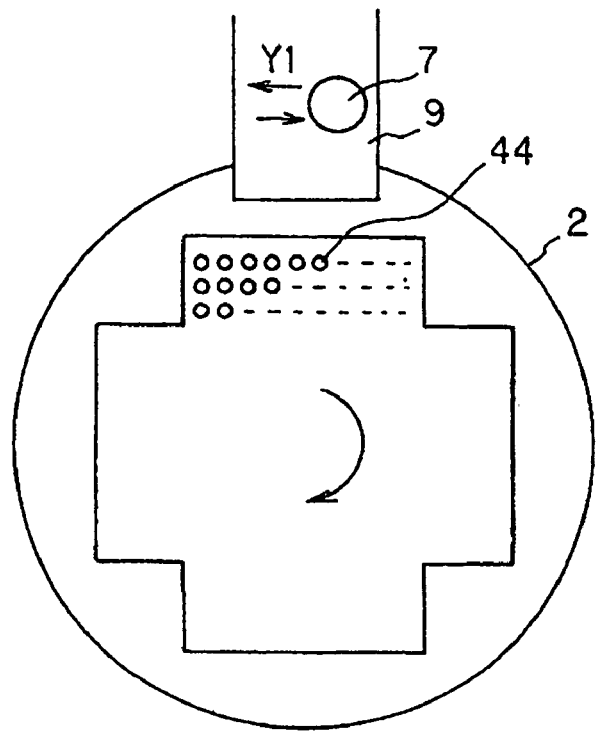
FIGS. 2(a) and (b) illustrate a relationship between a tip portion of ejection tube in the microsphere arranging apparatus and a semiconductor device mounted on a mount base.
Figure 2B:
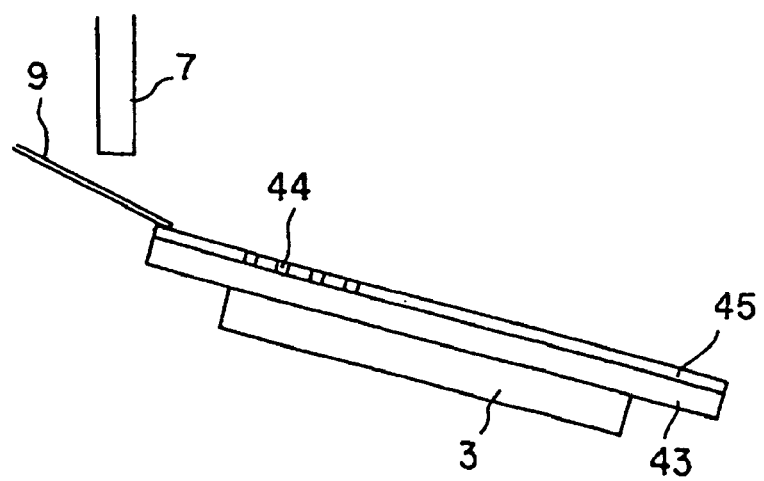

FIG. 2(a), (b) illustrates the relationship between the tip portion of ejection pipe 7 and the semiconductor device 2.

A flow plate 9 is disposed at the top end of the semiconductor device 2, and conductive liquid containing a number of microspheres 47 falls from the tip of ejection pipe 7 to the flow plate 9.

The conductive liquid is, for example, of ethanol. Other than ethanol, alcohols such as methanol, isopropyl alcohol, butanol, cyclohexanol, glycenol and ethyleneglycol are available. Further, it may be water etc. or a mixture of these. Further, it may contain a small amount of additive agents such as dispersing agents and surfactants. For example, the additives are disodium phosphate hydrate, sodium hexametaphosphate, sodium pyrophosphate, sodium linoleate, or cation activator. Liquids with high conductivity are preferable because they provide highly effective static protection.

The microspheres 47 have a diameter of, e.g., 100 μm or less, i.e., 0.1 mm or less. The thickness of conductive liquid flowing through the inclined surface of semiconductor device 2 is about 1 to 2 mm. As compared to the size of microspheres 47, the thickness (depth) is ten to twenty times. Thus, it is equivalent to the case that microspheres 47 are arranged in a bath with conductive liquid, and the same effect of static protection etc. can be obtained thereby. The outlet of ejection pipe 7 is, as shown an arrow Y1 in FIG. 2(a), shifted from side to side by a pipe shift mechanism 10 so as to supply the conductive liquid onto the entire surface of semiconductor device 2.

Figure 3A:
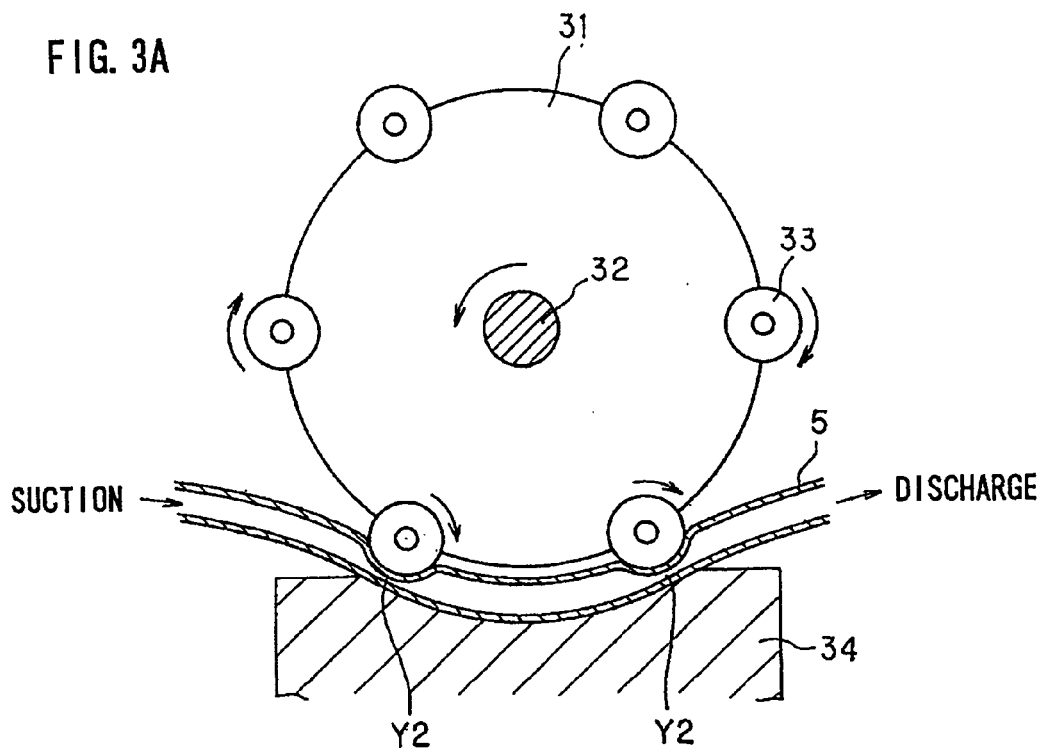
FIGS. 3(a) and (b) show the composition of a pump of the microsphere arranging apparatus.

Further, the circulation pipe 5 is provided with a pump 11 that serves to send the conductive liquid and microspheres 47 accumulated in the transfer bath 1 to the storage container 6. The pump 11 is, as shown in FIG. 3(a), composed of: a roller rotating body 31 that its rotation shaft 32 is fixed to a motor (not shown) and that rotates together with the rotation shaft 32 according to the rotation of motor so as to send the conductive liquid and microspheres 47 from the transfer bath 1 to the storage container 6; a plurality of rollers 33 that are attached evenly and rotatably on the circumference of roller rotating body 31; and a circulation tube pressing base 34 that is disposed to sandwich the circulation pipe 5 between the roller 33 and the base 34.

Figure 3B:
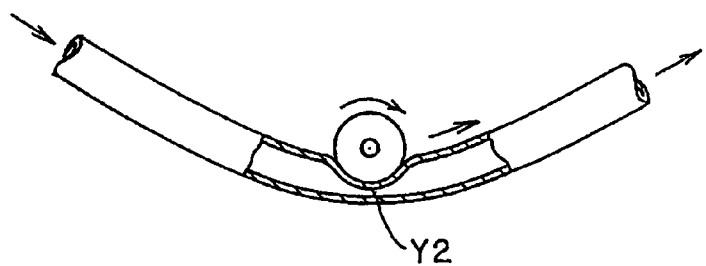

The distance between the roller 33 and the circulation tube pressing base 34 is set such that, as shown in FIG. 3(b), therebetween and at part of circulation pipe 5 (tube with elasticity) pressed by the rotation of roller 33, a gap Y2 is provided that allows a microspheres 47 to pass through while having their original shape.

Next, the composition of semiconductor device 2 will be explained with reference to FIG. 4.

FIG. 4 is a cross sectional view showing the composition of a semiconductor device.

The semiconductor device 2 as shown in FIG. 4 is composed of: a semiconductor wafer (hereinafter simply referred to as semiconductor wafer) 43 that predetermined semiconductor elements and interconnections are formed and a number of pads 42 connected to the predetermined interconnection are arranged on the surface; and a resist 45 is provided with holes 44 to mount one of the microspheres 47 at each of the pads 42.

Provided that the thickness of resist 45 is h, the diameter (hereinafter referred to as microsphere diameter) of one of microspheres 47 used is d, and the accuracy of microsphere diameter d is ±α microns (μm), microsphere diameter minimum diameter dmin=d−α, and microsphere diameter maximum diameter dmax=d+α.

Further, it is preferable to satisfy the condition that the thickness h of resist 45 to accommodate the microspheres 47 in the hole 44 is:

½dmax<h≦dmin

Further, provided that the diameter (hereinafter referred to as resist hole diameter) of hole 44 in the resist 45 is D, a dispersion in processing of hole 44 in the resist 45 is ±β microns, and a clearance needed to accommodate microspheres 47 with the maximum diameter dmax is γ microns, the minimum resist hole diameter Dmin=D−β has to be equal to or greater than a value obtained by adding a clearance 2γ to the maximum microsphere diameter dmax. Accordingly, it is preferable to satisfy the conditions:

D+β=Dmax (maximum resist hole diameter)

D−β=Dmin (minimum resist hole diameter)

D−β=Dmin≧dmax+2γ

Dmin−dmax≧2γ

Figure 6:
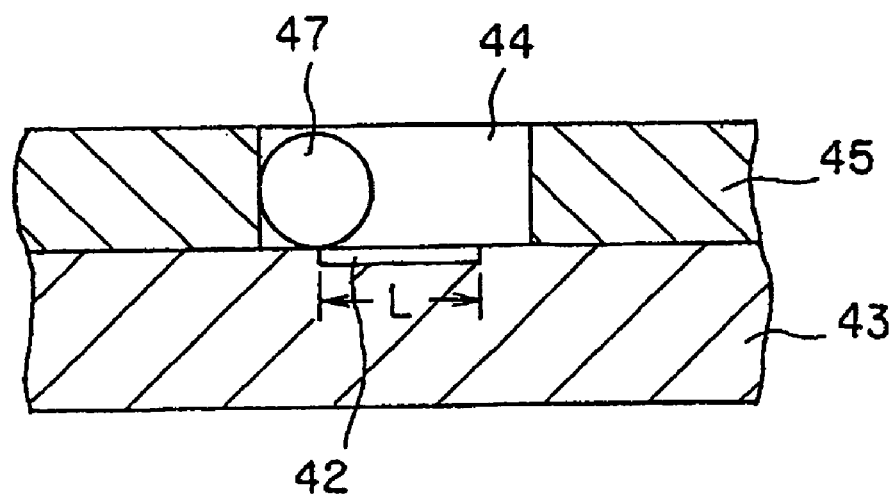
FIG. 6 illustrates a situation that a microsphere deviates from an underlying pad diameter because of a resist hole providing an excessively large gap.

For example, if microspheres 47 with a diameter of 100 microns are used, the clearance 2γ is suitably 5 to 30 microns. However, according as [Dmin-dmax] to give 2γ increases, two of the microspheres 47 may be entered in one hole 44 and it becomes difficult to dispose just one therein. On the other hand, it should be unlikely that the microspheres 47 slip out of a pad with diameter L as shown in FIG. 6. Accordingly, in consideration of the thickness h of resist 45, it is necessary to select the clearance:

2γ=Dmin−dmax

Furthermore, in accommodating one of the microspheres 47 into the resist hole 44 in the liquid, a gas such as air may prevent the microspheres 47 from entering thereinto since the resist hole 44 is very small. Therefore, it is necessary to provide a relief passage (hereinafter referred to as relief groove) for gas or liquid in connection with the resist hole 44.

Figure 7A:
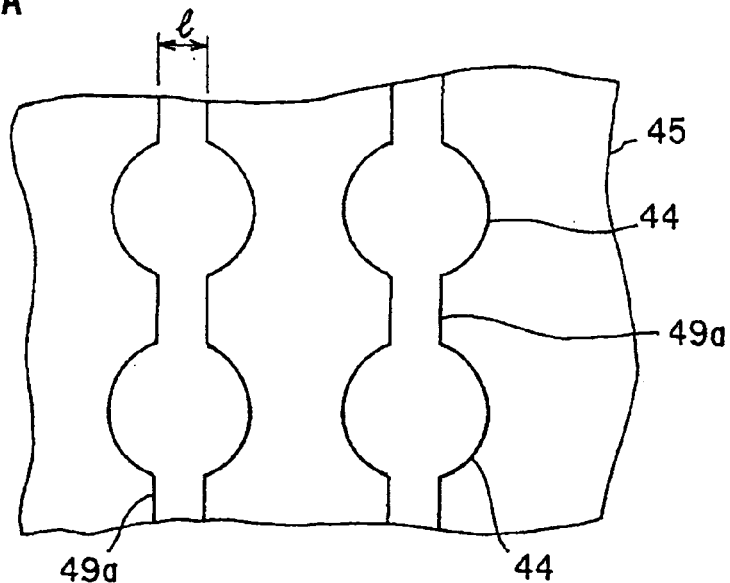
FIGS. 7(a), (b) and (c) are plan views showing a relief groove formed in connection with the resist hole.
Figure 7B:
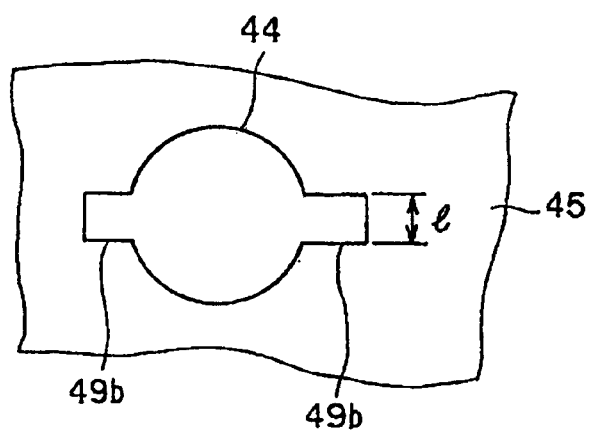
Figure 7C:
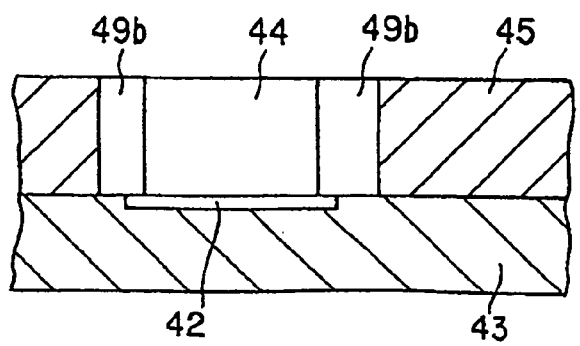

The relief groove can be formed, e.g., by etching the resist 45. As shown in FIG. 7(a), a relief groove 49a to connect holes 44 may be provided. Also, as shown in FIG. 7(b), a relief groove 49b formed at both sides (or one side) of the hole 44 may be provided.

The relief grooves 49a, 49b need to have such a width l such that a gas or liquid can flow through without being retained since the gas or liquid is difficult to relieve or flow if the width l is too narrow. For example, the width may be 5 microns or more.

Figure 5:
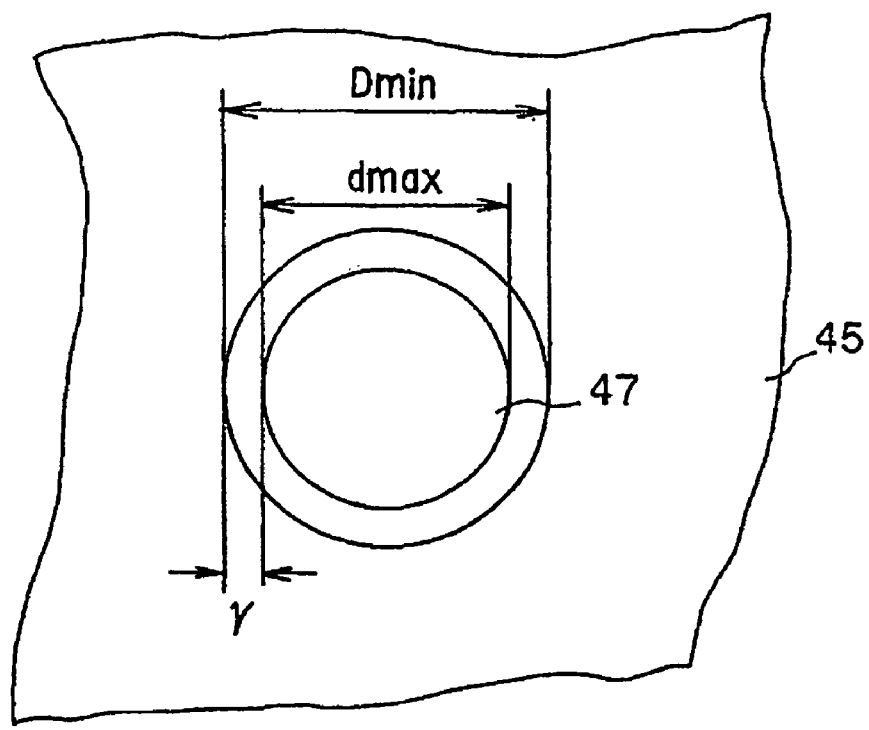
FIG. 5 is a plan view showing a gap required in accommodating a microsphere with a maximum diameter in a resist hole.

The accuracy of width l of relief groove is given such that the position of one of the microspheres 47 located therein does not get out of a minimum pad diameter $Lmin=L-\sigma$, where a dispersion in processing is $\beta$ and a dispersion in processing of pad diameter L is $\sigma$. It is preferable that: $Dmax-dmin+\{dmin-\sqrt{(dmin^2-lmax^2)}\} \leq Lmin$, and $lmax < \sqrt{\{dmin^2-(Dmax-Lmin)^2\}}$ Furthermore, it should be considered that there is a deviation in position between the pad 42 and the hole 44. Although FIG. 5 shows the case that the centers are aligned with each other, their positions in most cases deviated from perfect alignment.

Next, the process of arranging microspheres 47 into the arrangement holes 44 of semiconductor device 2 will be explained, where the method of arranging microspheres 47 with liquid using the microsphere arranging apparatus abovementioned is applied.

In this embodiment, the method of arranging microspheres 47 onto the semiconductor device 2 is conducted such that the arrangement pallet is not used, the semiconductor device 2 is placed in the air while being mounted on the mount base 3, and, in the air, the microspheres 47 are directly mounted on the pad 42 by mixing them with conductive liquid.

At first, the semiconductor device 2 with no microspheres 47 is mounted on the mount base 3 that is angle-adjusted to be horizontal. Then, by inclining the mount base 3 at a predetermined angle suitable for the arrangement of microspheres 47, the semiconductor device 2 is located inside (at the in-air position of) the transfer bath 1. At that time, the outlets of washing pipe 8 and ejection pipe 7 are retracted at a position that does not prevent the mounting of semiconductor device 2 onto the mount base 3.

Then, the washing pipe 8 is moved such that the outlet of washing pipe 8 is located over the semiconductor device 2 mounted on the mount base 3. At that time, since the pump 11 is stopped, the storage container 6 is vacant and therefore the conductive liquid does not flow out of the outlet of washing pipe 8 and ejection pipe 7.

When the pump 11 starts operating at a low speed, the conductive liquid retained in the transfer bath 1 and the flexible circulation pipe 5 is supplied to the storage container 6. Then, the conductive liquid is ejected through the washing pipe 8 and falls on the semiconductor device 2. The conductive liquid fallen on the semiconductor device 2 is flown from the hole 44 through relief groove down to the transfer bath 1. Thereby, gas in the hole 44 can be removed. When a certain time elapses, the outlet of washing pipe 8 is retracted.

Subsequently, when the pump 11 starts operating at a high speed, the microspheres 47 retained in the transfer bath 1 and the flexible circulation pipe 5 are, with conductive liquid, supplied to the storage container 6. Specifically, the elastic circulation pipe 5 (tube) is sequentially pressed by rotating the roller 33, and the conductive liquid including the microspheres 47 are sent forward while being choked through circulation pipe 5. Further, suction is generated by the passing of roller 33, and the conductive liquid is sequentially sucked and continuously supplied (transported).

When the outlet of ejection pipe 7 is shifted as shown by the arrow Y1 in FIG. 2(a), the microspheres 47 and conductive liquid are ejected through the ejection pipe 7 and uniformly falls on the semiconductor device 2. A portion of microspheres 47, which have fallen on the semiconductor device 2, enter in the hole 44; and the other part of the microspheres 47 with conductive liquid, are dropped on the bottom of transfer bath 1. If the conductive liquid is not accumulated in the transfer bath 1 and the semiconductor device 2 is in the air, the microspheres 47 ejected from the ejection pipe 7 together with the conductive liquid are accommodated in hole 44 and the rest of microspheres 47 are dropped in the transfer bath 1.

Since the hole 44 of semiconductor device 2 is provided with the relief groove being connected, the conductive liquid, which has entered in the hole 44, is flown down through the relief groove, and then dropped from the mount base 3 onto the bottom of transfer bath 1. Therefore, once the microspheres 47 have entered in the hole 44, they are not pushed out by the conductive liquid.

The microspheres 47 and the conductive liquid flown down in the transfer bath 1 are sent through the circulation pipe 5 connected to the bottom of transfer bath 1 to the storage container 6 by the operation of pump 11.

After ejectioning for a certain period of time, the pump 11 is switched into low speed operation, and the microspheres 47 which have flown down to the bottom of the transfer bath are retained at part of circulation pipe 5 and at the bottom of transfer bath 1 and, only conductive liquid is transported to the storage container 6.

The mount base 3 is inclined at such an angle that the microspheres 47 already accommodated in the hole 44 do not escape therefrom due to the pressure of liquid, and then the outlet of washing pipe 8 is shifted as shown by the arrows Y1 in FIG. 2(a).

This washing process corresponds to the shaking or oscillation of liquid in the in-liquid arrangement method that the semiconductor device 2 is placed. Thereby, excessive microspheres 47 being stacked in the hole 44 with one of the microspheres 47 already accommodated therein or being left on the surface of semiconductor device 2 can be removed, and the excessive microspheres 47 can be accommodated in another hole 44 where no microsphere is accommodated.

After washing for a certain period of time, the pump 11 stops operating, and thereby the microspheres 47 and the conductive liquid, flow down on the bottom of transfer bath 1, and are retained at part of circulation pipe 5 connected to the bottom of the transfer bath 1 and at the bottom of transfer bath 1, and the transportation of conductive liquid to the storage container 6 stops. As a result, the storage container 6 becomes vacant after the conductive liquid left therein completes the flowing down through the washing pipe 8 and the ejection pipe 7.

At the end, the mount base 3 is angle-adjusted to be horizontal, and the semiconductor device 2 with microspheres 47 arranged thereon is taken out.

By repeating the above process, the arrangement of microspheres 47 can be stably conducted while using the microspheres 47 and the conductive liquid repeatedly.

As described above, the microsphere arranging apparatus and the method of arranging microspheres with liquid in the first embodiment is composed such that the semiconductor device 2 is provided that includes: the semiconductor wafer 43 with the predetermined semiconductor element and interconnection and with a number of pads 42 connected the interconnection and attached on the surface thereof; and the resist 45 formed on the semiconductor wafer 43 while having the penetrating holes 44 formed at the respective pads 42 position to mount the microspheres 47, and the microspheres 47 are poured into the hole 44 while being transported thereto together with conductive liquid, thereby being mounted on the pad 42.

Thus, without using the conventional arrangement pallet, the microspheres 47 can be directly mounted on the pad 42 by pouring the microspheres 47 into the resist hole 44 of semiconductor wafer 43 while transporting it together with the conductive liquid. Accordingly, the conventional processes of accommodating the microspheres in the arrangement pallet and then transferring them to the resist hole 44 of semiconductor device 2 are not needed. Therefore, the manufacturing cost can be reduced and the step of transferring the microspheres 47 to the hole 44 of semiconductor device 2 in the bump electrode forming process can be simplified. In the above embodiment, the microspheres 47 are solder balls. The solder ball may be a ball consisting of solder, a plastic core covered with solder, a gold ball or a copper ball with silver plating, or various conductive microballs.

Further, since the above semiconductor device 2 has the resist 45 with a thickness of greater than ½ the maximum diameter of one of the microspheres 47 and less than the minimum diameter, one of the microspheres 47 can be surely accommodated in the hole 44 and can be mounted on the pad 42.

Further, the minimum diameter of hole 44 to be generated in the manufacture accuracy is made to be greater than a value obtained by adding the clearance to the maximum diameter of one of the microspheres 47, and the maximum diameter of hole 44 is set such that more than one of the microspheres 47 cannot enter into one hole 44 and none of the microspheres 47 can escape from the pad diameter L. Because of this, one of the microspheres 47 can be surely mounted on the pad 42.

Further, since the relief groove used to flow the gas or conductive liquid from the hole 44 is formed to connect with the hole 44, the microspheres 47 can be accommodated smoothly and securely. Therefore, one of the microspheres 47 can be surely mounted on the pad 42.

Although in the above embodiment the thickness of resist 45 and the diameter of hole 44 are determined such that only one of the microspheres 47 enters into the hole 44 of semiconductor device 2, two microspheres 47 may be vertically accommodated in the hole 44, e.g., if the microspheres 47 are solder balls with plastic core contained therein.

The circulation pipe 5 has a clearance that allows the microspheres 47 to pass through while keeping their original shape, at the pressing part when the microspheres 47 are transported by means of the pump 11. Because of this, the microspheres 47 can be securely accommodated in the hole 44 of semiconductor device 2 without being deformed, crushed or defaced.

Figure 8:
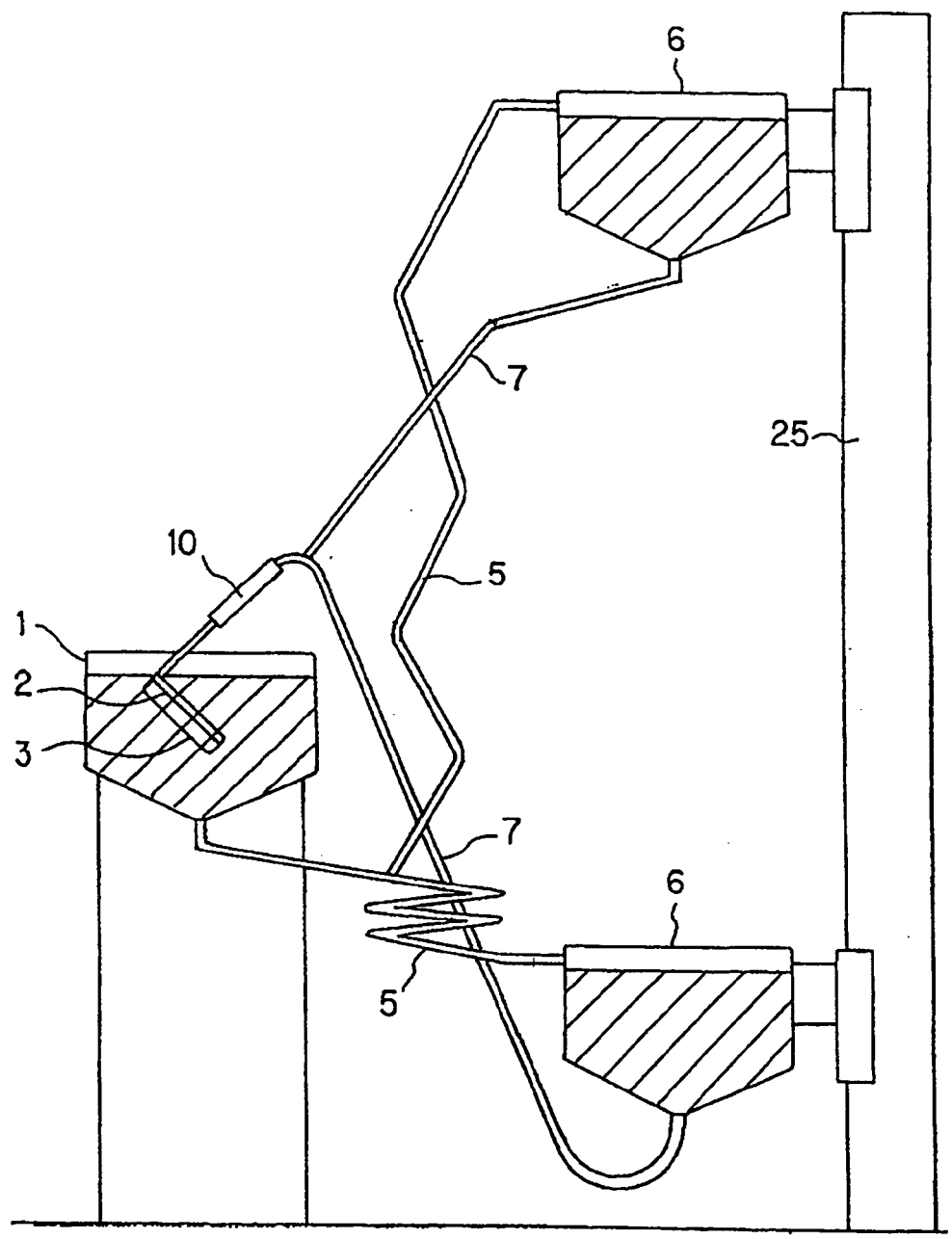
FIG. 8 shows the composition of a microsphere arranging apparatus in a second preferred embodiment of the invention.

FIG. 8 shows the composition of a microsphere arranging apparatus in the second preferred embodiment of the invention.

The liquid flow-down type arrangement method of moving microspheres 47 to the semiconductor device 2 in this embodiment is conducted such that, without using the arrangement pallet, the semiconductor device 2 mounted on the mount base 3 is disposed in the conductive liquid, and the microspheres 47 are directly mounted on the pad 42 by pouring the microspheres 47 into the pad 42 together with the conductive liquid.

The microsphere arranging apparatus in FIG. 8 is different from that in the first embodiment in that the storage container 6 can be upward and downward moved by a storage container vertical movement means 25. At first, the storage container 6 waits at a position lower than the transfer bath 1 while containing the microspheres 47 and conductive liquid. When, the semiconductor device 2 is mounted on the mount base 3, the storage container 6 is elevated by operating the storage container vertical movement means 25. Accordingly, as the storage container 6 is moved higher than the transfer bath 1, the microspheres 47 and conductive liquid contained in the storage container 6 are ejected through the ejection pipe 7 and falls on the semiconductor device 2 in the conductive liquid. A portion of the microspheres 47 falling on the semiconductor device 2 settles into the hole 44 and the remaining microspheres 47 and conductive liquid flow into the transfer bath 1.

The microspheres 47 and conductive liquid which have flown into the bottom of transfer bath 1 are retained at part of the circulation pipe 5 connected with the bottom of transfer bath 1 and at the bottom of transfer bath 1.

When the microspheres 47 and conductive liquid contained in the storage container 6 are completely ejected, the storage container 6 is moved down to the lower position, and the microspheres 47 and conductive liquid retained at part of the circulation pipe 5 connected with the bottom of transfer bath 1 and at the bottom of transfer bath 1 flow into the storage container 6 through the circulation pipe 5.

The microsphere arranging apparatus and the method of arranging microsphere with liquid in the second embodiment have the same effects as that in the first embodiment.

Further, since the microspheres 47 and conductive liquid are circulated by moving up and down the storage container 6, instead of using the pump 11, the microspheres 47 can be securely accommodated in the hole 44 of semiconductor device 2 without being deformed, crushed or defaced.

Although in the first and second embodiments, the microspheres 47 are supplied to the resist 45 on the semiconductor wafer 43, the semiconductor wafer 43 may be replaced by a wiring board, a semiconductor chip etc. Such an embodiment is included in the technical scope of the invention.

In the first and second embodiments, if an oscillating means to oscillate the mount base 3 is incorporated, the microspheres 47 can be faster accommodated in the hole 44 of semiconductor device 2. Thereby, the working efficiency can be enhanced and the manufacturing cost can be reduced.

Figure 9:
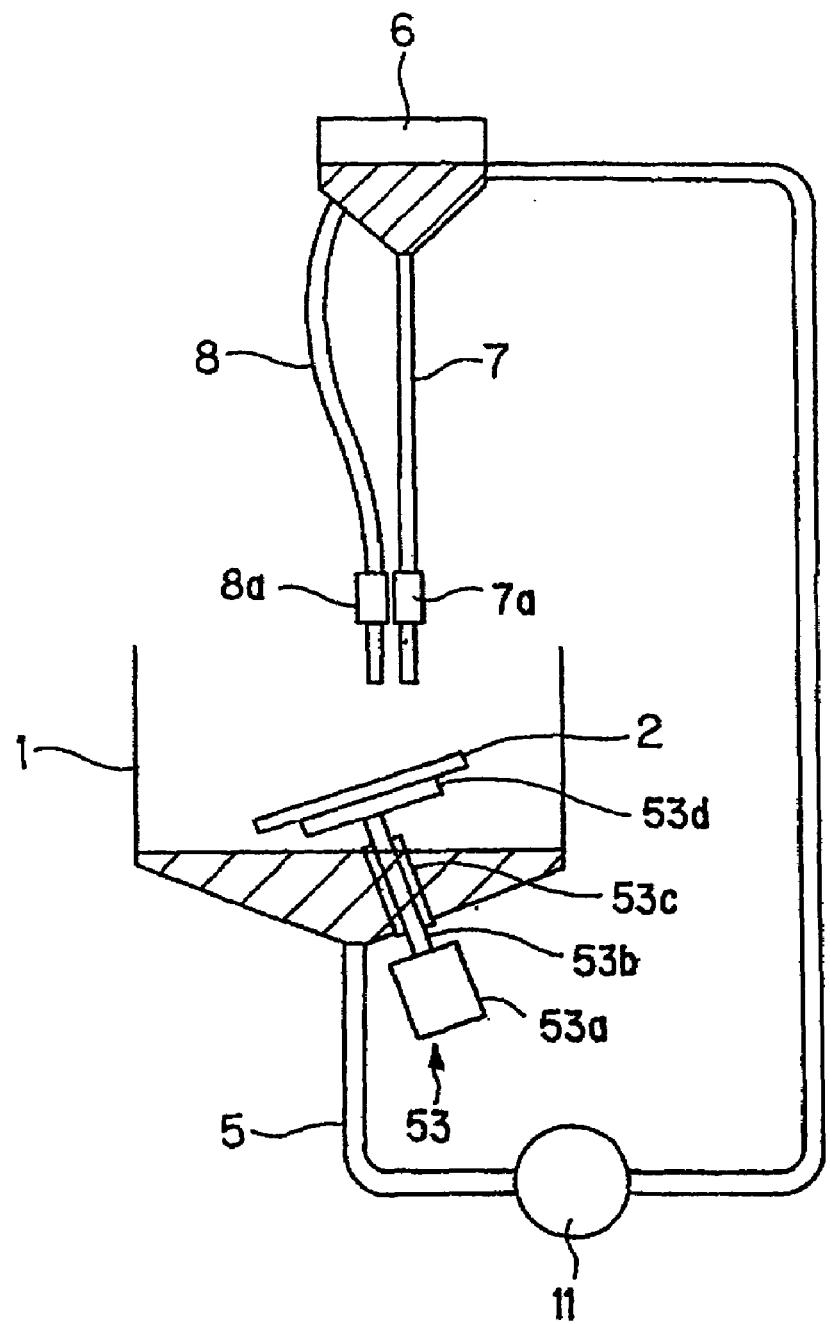
FIG. 9 shows the composition of a microsphere arranging apparatus in a third preferred embodiment of the invention.

FIG. 9 shows the composition of a microsphere arranging apparatus in the third preferred embodiment of the invention.

The microsphere arranging apparatus as shown in FIG. 9 is composed of: a transfer bath 1; a rotary mounting unit 53 that the semiconductor device 2 is mounted thereon and rotated thereby; a pump 11; a circulation pipe 5; a storage container 6; an ejection pipe 7; a washing pipe 8, a microsphere supplying nozzle 7*a*; and a washing nozzle 8*a*.

The transfer bath 1 is a funnel-shaped container formed by combining a cylinder and a cone, and it accommodates a conductive liquid containing a number of microspheres 47. The transfer bath 1 has an opening formed at the lowest portion and the storage container 6 has an opening formed at the side face. The flexible circulation pipe 5, is connected between the openings through the pump 11.

The storage container 6 is a funnel-shaped container formed by combining a cylinder and a cone, and it is placed and fixed over the transfer bath 1 by a supporting member (not shown), and it accommodates a conductive liquid containing a number of microspheres 47. The storage container 6 has an opening formed at the lowest portion, and one end of the ejection pipe 7 with the microsphere supplying nozzle 7a attached thereto is connected to this opening. The storage container 6 also has an opening formed at an arbitrary position on the upper portion of its inclined surface, and one end of the washing pipe 8 with the washing nozzle 8a attached thereto is connected to this opening. The storage container 6 is sealed up except at the pipe-connected portions so as to prevent the volatilization of volatile conductive liquid as much as possible.

The rotary mounting unit 53 is built near the lowest portion of transfer bath 1, and it is composed of: a motor 53a; a rotating shaft 53b of the motor 53a; a bearing 53c shaped like an elongated cylinder; and a mount base 53d. The motor 53a is disposed outside the transfer bath 1, and the rotating shaft 53b of motor 53a is rotatably inserted into a penetration hole of the bearing 53c that is fixed at the lower portion of the inclined surface of transfer bath 1. The tip of rotating shaft 53b is secured to the center of mount base 53d. Namely, the mount base 53d is disposed such that, it is inclined inside the transfer bath 1. The mount base 53d is rotated with the rotating shaft 53b of motor 53a, and thereby the semiconductor device 2 mounted on the mount base 53d is rotated.

The inclination angle of mount base 53d is set such that, after microspheres 47 are accommodated in the hole 44 of mounted semiconductor device 2 thereof, the microspheres 47 are not spun out from the hole 44 by centrifugal force, and they are not released therefrom due to the pressure of conductive liquid flowing from the washing nozzle 8a. A shield for waterproofing is disposed between the bearing 53c and the rotating shaft 53b.

Figure 10A:
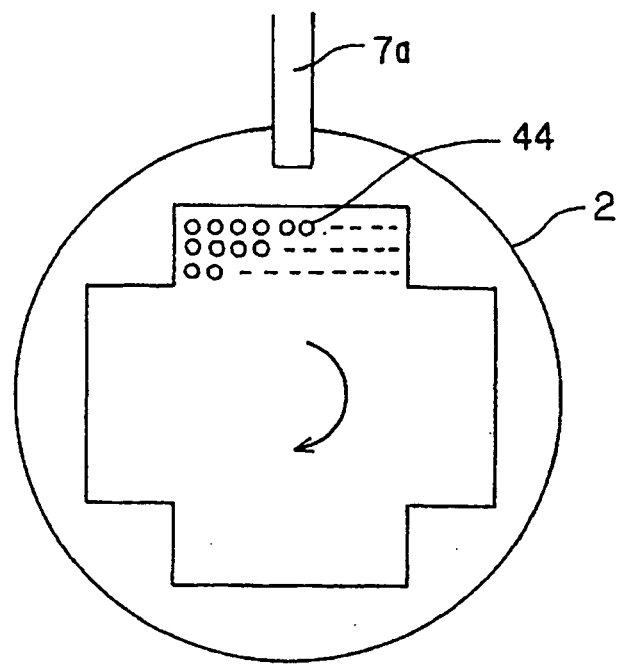
FIGS. 10(a) and (b) illustrate a situation that a semiconductor device is mounted on a rotary mounting unit of the microsphere arranging apparatus.
Figure 10B:
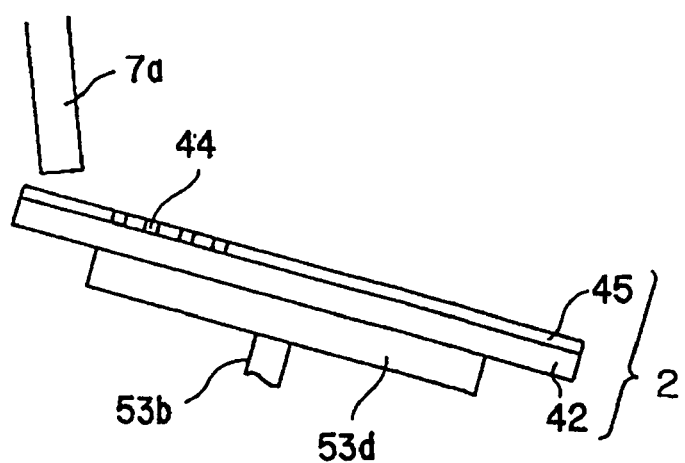

The relationship between the microsphere supplying nozzle 7a and the semiconductor device 2 mounted on the mount base 53d will be explained below with reference to FIGS. 10(a) and 10(b).

Conductive liquid containing a number of microspheres 47 flows down from the tip of microsphere supplying nozzle 7a disposed over the top face of semiconductor device 2. The microspheres 47 have a diameter of 100 μm or less, i.e. 0.1 mm or less, and the conductive liquid flowing down on the inclined surface of semiconductor device 2 has a thickness of about 1 to 2 mm. Thus, as compared to the size of microspheres 47, the thickness (depth) is 10 to 20 times, and this is nearly equivalent to the case that the microspheres 47 are arranged in the bath with conductive liquid. Also, this method provides the same static protection, etc. In order to pervade the conductive liquid onto the entire surface of semiconductor device 2, the semiconductor device 2 is rotated and the microsphere supplying nozzle 7a is placed at the highest point of semiconductor device 2.

The pump 11 interposed on the path of the circulation pipe 5 serves to transport the conductive liquid and microspheres 47 retained in the transfer bath 1 to the storage container 6.

Next, the process of arranging, in the air, the microspheres 47 into the arrangement hole 44 of semiconductor device 2 by using the microsphere arranging apparatus thus composed will be explained.

The liquid flow-down type arrangement method in this embodiment to arrange the microspheres 47 onto the semiconductor device 2 is conducted such that, without using the arrangement pallet, the microspheres 47 are directly arranged on the pad 42 on the semiconductor device 2 mounted on the mount base 53d being inclined by the motor 53a by pouring and rotating the microspheres 47 together with the conductive liquid, in the air.

At first, the semiconductor device 2 with no microspheres 47 arranged thereon is mounted on the inclined mount base 53a disposed inside (at the in-air position of) the transfer bath 1. At that time, the microsphere supplying nozzle 7a and washing nozzle 8a are retracted at a position that allows the mounting of semiconductor device 2 onto the mount base 53d.

The washing nozzle 8a is shifted such that it is located over the semiconductor device 2 mounted on the mount base 53d. At that time, the storage container 6 is vacant because the pump 11 is stopped, and no conductive liquid is ejected from the nozzles 7a and 8a.

Then, the semiconductor device 2 mounted on the mount base 53d is rotated by driving the motor 53a. Further, by operating the pump 11 at a low speed, conductive liquid retained in the transfer bath 1 and the flexible circulation pipe 5 is supplied to the storage container 6. Then, conductive liquid is ejected from the washing nozzle 8a through the washing pipe 8 and falls on the semiconductor device 2 being rotated. The conductive liquid fallen on the semiconductor device 2 enters the respective holes 44 while moving downward and in the rotation direction of the semiconductor device 2, further passing through a relief groove (not shown) and then falling into the transfer bath 1. Thereby, gas in the hole 44 is removed. When a certain time elapses, the washing nozzle 8a is retracted.

Then, by operating the pump 11 at a high speed, the microspheres 47 retained in the transfer bath 1 and circulation pipe 5 are supplied to the storage container 6 together with conductive liquid. Thereby, the microspheres 47 and conductive liquid are ejected through the ejection pipe 7 from the microsphere supplying nozzle 7a, and uniformly fall on the semiconductor device 2 being rotated. The microspheres 47 on the semiconductor device 2 enter the hole 44 while being moved in the circumferential direction of semiconductor device 2, and the rest of microspheres 47 and conductive liquid fall into the transfer bath 1.

The microspheres 47 and conductive liquid fallen into the transfer bath 1 are transported, through the circulation pipe 5 connected to the lowest portion of the transfer bath 1, to the storage container 6 by the operation of pump 11. After a period of ejection, the pump 11 is switched into the low speed operation. Thereby, only the microspheres 47 are retained in part of the circulation pipe 5 being connected to the lowest portion of the transfer bath 1 and at the bottom of transfer bath 1, and only the conductive liquid is transported to the storage container 6.

At that time, the washing nozzle 8a is shifted again over the semiconductor device 2 mounted on the mount base 53d.

This washing process corresponds to the shaking or oscillation of liquid in the in-liquid arrangement method that the semiconductor device 2 is soaked. Thereby, excessive microspheres 47 being stacked in the hole 44 with one of the microspheres 47 already accommodated therein or being left on the surface of semiconductor device 2 can be removed, and the excessive microspheres 47 can be accommodated in another hole 44 with no microsphere accommodated therein.

After a period of washing, the pump 11 is stopped. Thereby, the microspheres 47 and conductive liquid fallen into the transfer bath 1 are retained at part of the circulation pipe 5 being connected to the lowest portion of the transfer bath 1 and at the bottom of transfer bath 1, and the transportation of conductive liquid to the storage container 6 is stopped. At the time of stopping, conductive liquid left in the storage container 6 falls through the nozzles 7a and 8a and thereby the storage container 6 becomes vacant. Finally, the semiconductor device 2 with the microspheres 47 arranged thereon is released from the mount base 53d.

By repeating such operations, the microspheres 47 can be stably arranged while using the microspheres 47 and conductive liquid repeatedly.

Figure 11:
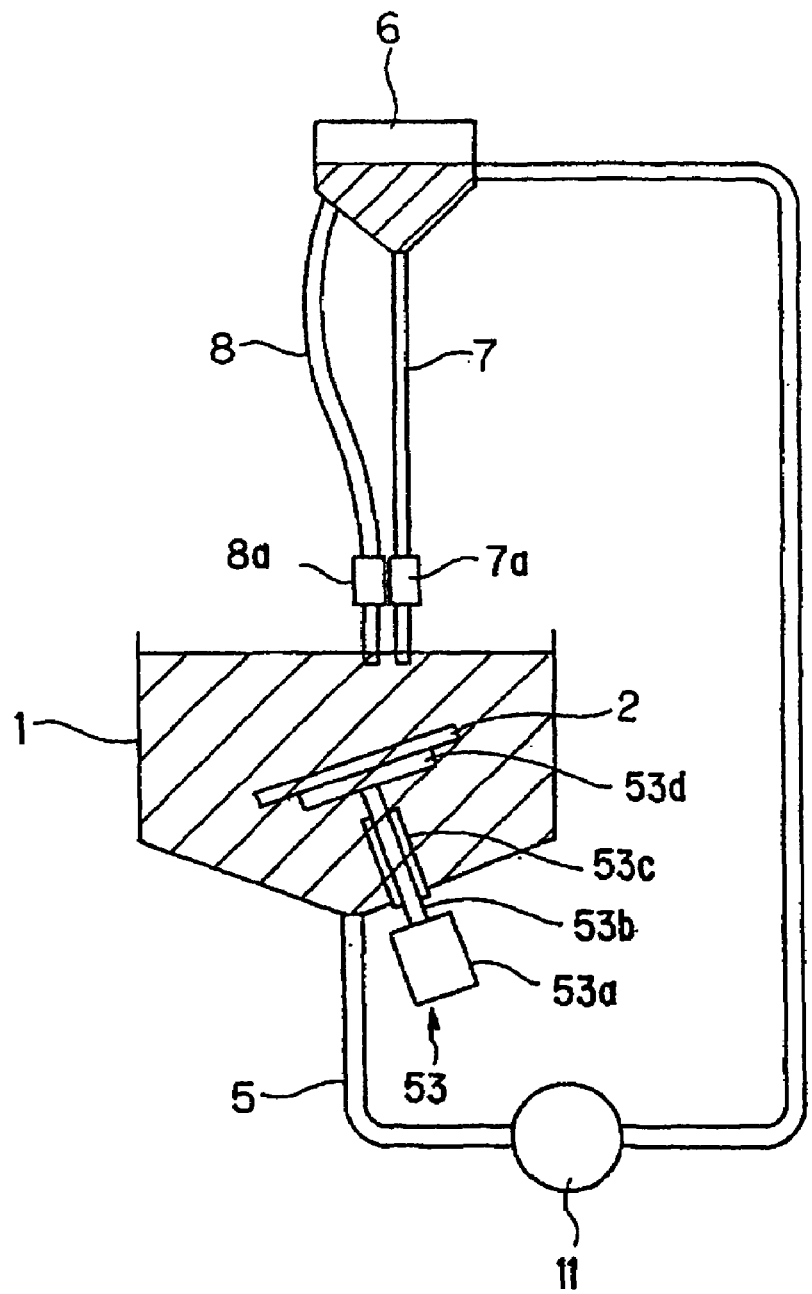
FIG. 11 illustrates a situation that a semiconductor device is mounted on a rotary mounting unit being soaked in conductive liquid in the microsphere arranging apparatus in the third embodiment of the invention.

Alternatively, by using a microsphere arranging apparatus with a similar construction, as shown in FIG. 11, the microspheres 47 may be, in the conductive liquid, arranged onto the arrangement hole 44 of semiconductor device 2. Namely, this liquid flow-down type arrangement method to arrange the microspheres 47 onto the semiconductor device 2 is conducted such that, without using the arrangement pallet. While rotating with the motor 53a, the microspheres 47 are directly arranged on the pad 42 by pouring the microspheres 47 together with the conductive liquid of the transfer bath 1, and the inclined semiconductor device 2 mounted on the mount base 53d.

In this case, the microspheres 47 ejected together with the conductive liquid from the microsphere supplying nozzle 7a, and fall on the semiconductor device 2 being rotated. The microspheres are then accommodated in the hole 44 of the semiconductor device 2 while being moved downward and rotated.

However, by using, e.g., a mechanism to make the rotating shaft 53b extend and contract, the semiconductor device 2 mounted on the mount base 53d can be controllably located in the conductive liquid or in the air, whereby the setting and releasing of semiconductor device 2 can be facilitated. Further, the storage container 6 with a capacity greater than that of transfer bath 1 may be used. In this case, while closing the ejection port of nozzles 7a, 8a temporarily, by using the pump 11, conductive liquid in the transfer bath 1 may be completely transported to the storage container 6 or may be transported thereto until the mount base 53d is exposed to the air, in order to allow the setting and releasing of semiconductor device 2.

As described above, the microsphere arranging apparatus and the method of arranging microspheres with liquid in the third embodiment is composed such that the semiconductor device 2 consists of: the semiconductor wafer 43 with the predetermined semiconductor element and interconnection and with a number of pads 42 connected to the interconnection and attached on the surface thereof; and the resist 45 formed on the semiconductor wafer 43 while having the penetrating holes 44 formed at the respective pads 42 position to mount the microspheres 47 on the inclined mount base 53d. The microspheres 47 are, together with conductive liquid, ejected from the microsphere supplying nozzle 7a to the upper portion of semiconductor device 2 while rotating the mount base 53d by the rotating shaft 53b of motor 53a, thereby pouring the microspheres 47 into the hole 44 of semiconductor device 2 to mount it on the pad 42.

Thus, without using the conventional arrangement pallet, the microspheres 47 can be directly mounted on the pad 42 by pouring the microspheres 47 into the resist hole 44 of semiconductor wafer 43 while transporting it together with the conductive liquid. In this case, the microspheres 47 are accommodated in the hole 44 while being moved by the centrifugal force of the semiconductor wafer 43 being rotated. Thus, the microspheres can be efficiently accommodated in the hole 44. Further, the conventional processes of accommodating the microspheres in the arrangement pallet and then transferring them to the resist hole 44 of semiconductor device 2 are not needed. Accordingly, the microspheres 47 can be efficiently mounted on the pad 42. Further, the semiconductor device 2 is rotated even when it is washed and, therefore, the washing effect can be enhanced since the conductive liquid falling from the washing nozzle 8a is moved by the centrifugal force of semiconductor device 2.

Figure 12:
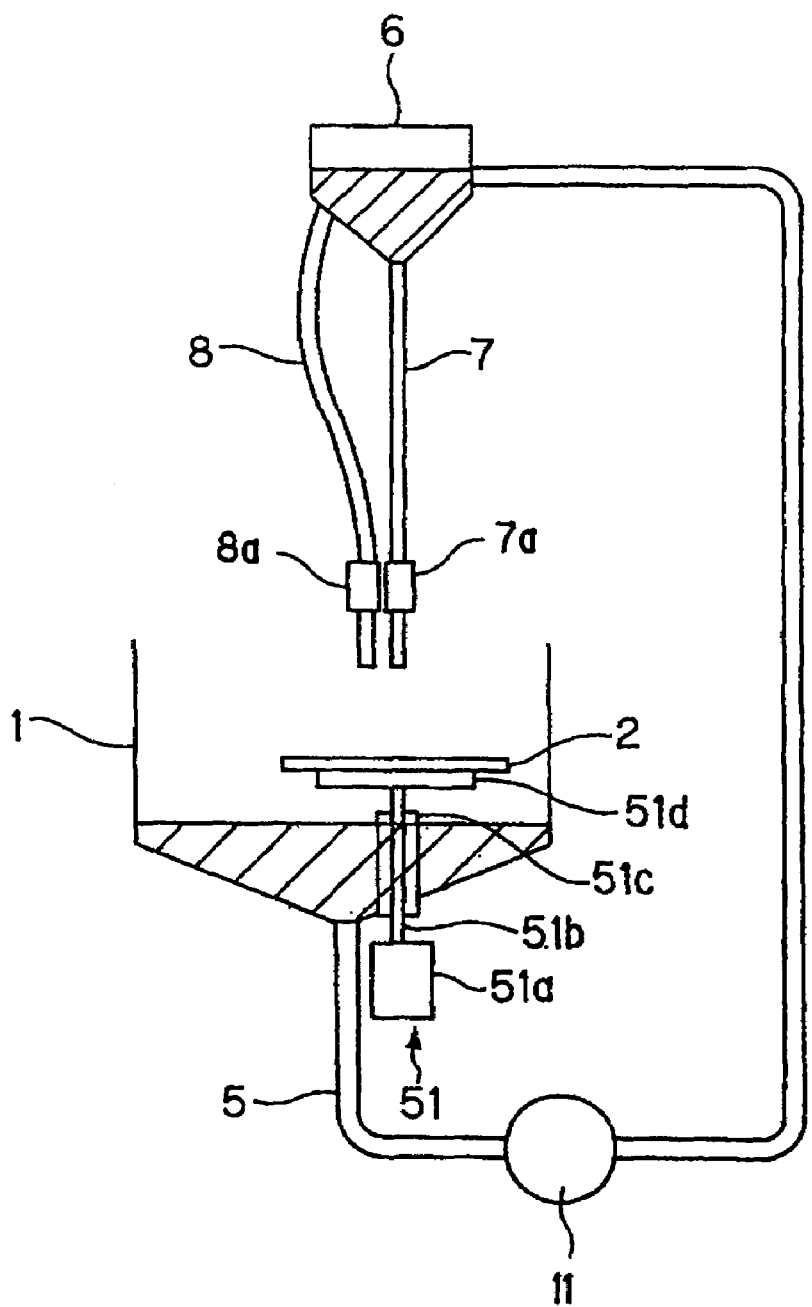
FIG. 12 shows the composition of a microsphere arranging apparatus in a fourth preferred embodiment of the invention.

FIG. 12 shows the composition of a microsphere arranging apparatus in the fourth preferred embodiment of the invention.

The microsphere arranging apparatus as shown in FIG. 12 is composed of: a transfer bath 1; a rotary mounting unit 51 that the semiconductor device 2 is mounted thereon and rotated thereby; a pump 11; a circulation pipe 5; a storage container 6; an ejection pipe 7; a washing pipe 8, a microsphere supplying nozzle 7a; and a washing nozzle 8a.

In this embodiment, the rotary mounting unit 51 is composed of: a motor 51a; a rotating shaft 51b of the motor 51a; a bearing 51c shaped like an elongated cylinder; and a mount base 51d. It is built in near the lowest portion of transfer bath 1 such that the mount base 51d is laid horizontally.

Namely, the mount base 51d is disposed horizontally inside the transfer bath 1. The mount base 51d is rotated with the rotating shaft 51b of motor 51a, and thereby the semiconductor device 2 mounted on the mount base 51d is rotated. The microsphere supplying nozzle 7a is disposed at the center or center portion of semiconductor device 2 mounted on the mount base 51d. The washing nozzle 8a is disposed adjacent to the microsphere supplying nozzle 7a.

Next, the process of arranging, in the air, microspheres 47 into the arrangement holes 44 of semiconductor device 2 will be explained, where the method of arranging microspheres 47 with liquid using the microsphere arranging apparatus abovementioned is applied.

The liquid flow-down type arrangement method is conducted such that the arrangement pallet is not used, and the semiconductor device 2 is placed in the air while being mounted on the horizontally disposed mount base 51d. The microspheres 47 are directly mounted on the pad 42 by pouring it together with conductive liquid.

At first, the semiconductor device 2 with no microspheres 47 is mounted on the mount base 51d that is disposed horizontally inside (at the in-air position of) the transfer bath 1. At that time, the washing pipe 8 and ejection pipe 7 are retracted to a position that does not prevent the mounting of semiconductor device 2 onto the mount base 51d.

Then, the washing nozzle 8a is shifted such that it is located over the semiconductor device 2 mounted on the mount base 51d. At that time, since the pump 11 stops, the storage container 6 is vacant and therefore the conductive liquid does not flow out of the nozzles 7a and 8a.

Then, the semiconductor device 2 mounted on the mount base 51d is rotated by driving the motor 51a. Further, by operating the pump 11 at a low speed, conductive liquid retained in the transfer bath 1 and the flexible circulation pipe 5 is supplied to the storage container 6. Then, conductive liquid is ejected from the washing nozzle 8a through the washing pipe 8 and falls on the center portion of the semiconductor device 2 being rotated. The conductive liquid fallen on the semiconductor device 2 enters the respective holes 44 while moving in the circumference direction by the centrifugal force of the semiconductor device 2, further passing through a relief groove (not shown) and then falling into the transfer bath 1. Thereby, gas in the hole 44 is removed. When a certain time (a time needed to wash the semiconductor device 2) elapses, the washing nozzle 8a is retracted.

Then, by operating the pump 11 at a high speed, the microspheres 47 retained in the transfer bath 1 and circulation pipe 5 are supplied to the storage container 6 together with conductive liquid. Thereby, the microspheres 47 and conductive liquid are ejected through the ejection pipe 7 from the microsphere supplying nozzle 7a, and falls on the center portion of the semiconductor device 2 being rotated. One of the microspheres 47 fallen thereon enters the hole 44 while being moved in the circumference direction by the centrifugal force of the semiconductor device 2, and the rest of microspheres 47 and conductive liquid falls into the transfer bath 1.

The microspheres 47 and conductive liquid, which have fallen into the transfer bath 1, are transported, through the circulation pipe 5 connected to the lowest portion of the transfer bath 1, to the storage container 6 by the operation of pump 11. After a period of time where ejection occurs, the pump 11 is switched into the low speed operation. Thereby, the microspheres 47 are retained at part of the circulation pipe 5 being connected to the lowest portion of the transfer bath 1 and at the bottom of transfer bath 1, and only the conductive liquid is transported to the storage container 6.

At that time, the washing nozzle 8a is shifted again such that it is located over the center portion of the semiconductor device 2 mounted on the mount base 51d, and then the washing process is conducted. Because of the washing process, excessive microspheres 47 being stacked in the hole 44 with one of the microspheres 47 already accommodated therein or being left on the surface of semiconductor device 2 can be removed, and the excessive microspheres 47 can be accommodated in another hole 44 with no microsphere accommodated therein.

After a period of washing, the pump 11 is stopped. Thereby, the microspheres 47 and conductive liquid, which have fallen into the transfer bath 1 are retained at part of the circulation pipe 5 being connected to the transfer bath 1 and at the bottom of transfer bath 1, and the transportation of conductive liquid to the storage container 6 is stopped. At the time of stopping, conductive liquid left in the storage container 6 falls through the nozzles 7a and 8a and thereby the storage container 6 becomes vacant. At the end, the semiconductor device 2 with the microspheres 47 arranged thereon is released from the mount base 51d.

By repeating such operations, the microspheres 47 can be stably arranged while using, the microspheres 47 and conductive liquid repeatedly.

Figure 13:
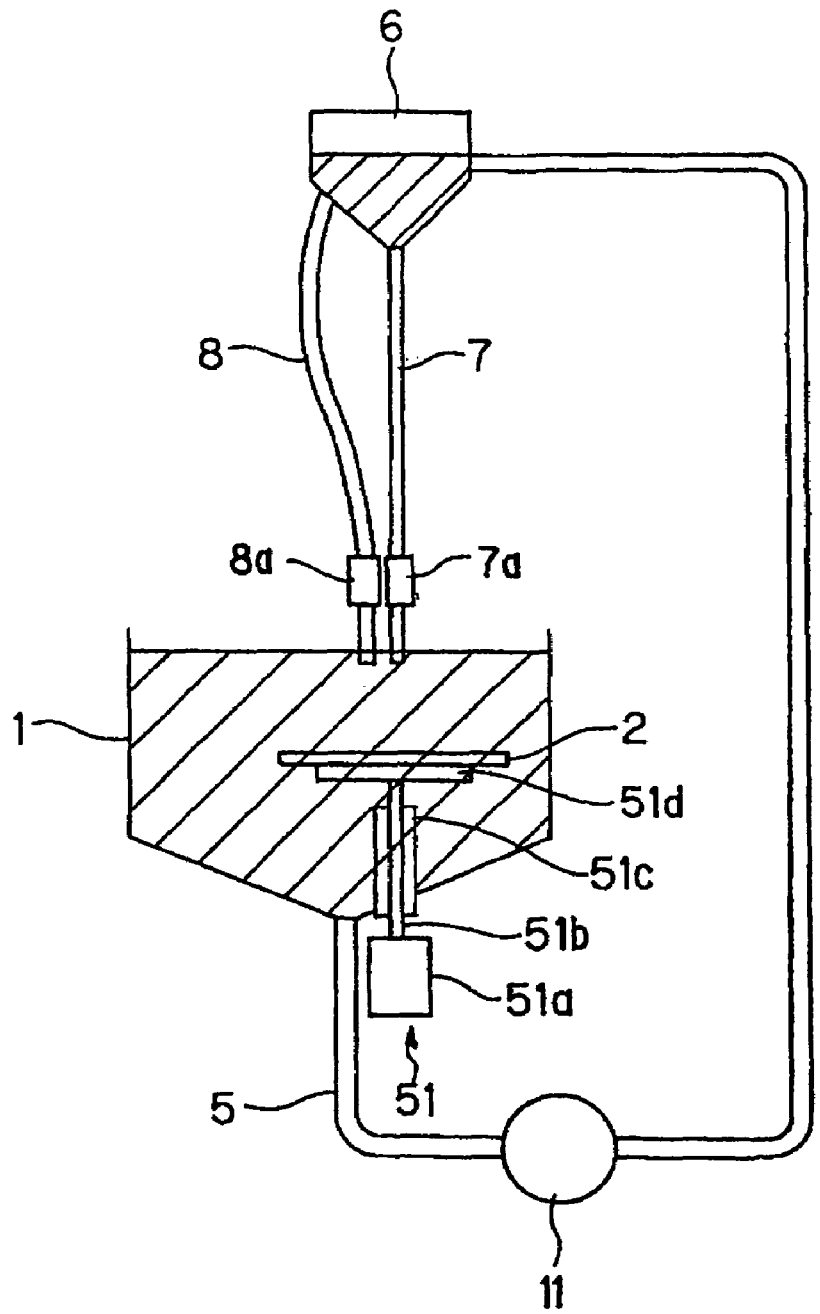
FIG. 13 illustrates a situation that a semiconductor device is mounted on a rotary mounting unit being soaked in conductive liquid in the microsphere arranging apparatus in the fourth embodiment of the invention.

Alternatively, by using a microsphere arranging apparatus with a similar construction, as shown in FIG. 13, the microspheres 47 may be, in the conductive liquid, arranged onto the arrangement hole 44 of semiconductor device 2. Namely, this liquid flow-down type arrangement method to arrange the microspheres 47 onto the semiconductor device 2 is conducted such that, without using the arrangement pallet, while rotating by the motor 51a, the microspheres 47 are directly arranged on the pad 42 by pouring the microspheres 47 together with the conductive liquid of transfer bath 1, when the semiconductor device 2 mounted on the mount base 51d is horizontally disposed.

In this case, the microspheres 47 in the conductive liquid are ejected from the microsphere supplying nozzle 7a, and fall on the center portion of the semiconductor device 2 being rotated. One of the microspheres 47 may be accommodated in the hole 44 while being moved in the circumferential direction by the centrifugal force of semiconductor device 2.

However, by using, e.g., a mechanism to make the rotating shaft 51b extend and contract, the semiconductor device 2 mounted on the mount base 51d can be controllably located in the conductive liquid or in the air, whereby the setting and releasing of semiconductor device 2 can be facilitated. Further, the storage container 6 with a capacity greater than that of transfer bath 1 may be used. In this case, while temporarily closing the ejection port of nozzles 7a, 8a, by using the pump 11, the conductive liquid in the transfer bath 1 may be transported to the storage container 6 permanently or until the mount base 51d is exposed to the air, in order to allow the setting and releasing of semiconductor device 2.

As described above, the microsphere arranging apparatus and the method of arranging microspheres with liquid in the fourth embodiment is composed such that the semiconductor device 2 consists of: the semiconductor wafer 43 with the predetermined semiconductor element and interconnection and with a number of pads 42 connected to the interconnection and attached on the surface thereof. Additionally, the resist 45 is formed on the semiconductor wafer 43 with penetrating holes 44 formed on the respective pads 42 in a position to mount the microspheres 47. The semiconductor wafer 43 is mounted on the mount base 53d that is disposed horizontally, and the microspheres 47, together with conductive liquid, are ejected from the microsphere supplying nozzle 7a to the center portion of semiconductor device 2 while the mount base 51d is rotated by the rotating shaft 51b of motor 51a Thereby, the microspheres 47 are poured into the hole 44 of semiconductor device 2.

Thus, without using the conventional arrangement pallet, one of the microspheres 47 can be directly mounted on the pad 42 by pouring the microspheres 47 and conductive liquid into the resist hole 44 of semiconductor wafer 43. In this case, one of the microspheres 47 is accommodated in the hole 44 while being moved from the center or center portion to the circumference by the centrifugal force caused by the rotation of the semiconductor wafer 43. Thus, it can be efficiently accommodated in the hole 44. Further, the conventional processes of accommodating the microspheres in the arrangement pallet and then transferring them to the resist hole 44 of semiconductor device 2 are not needed. Accordingly, one of the microspheres 47 can be efficiently mounted on the pad 42. Further, the semiconductor device 2 is rotated even during washing and, therefore, the washing effect can be enhanced since the conductive liquid falling from the washing nozzle 8a is moved by the centrifugal force of semiconductor device 2.

Figure 14:
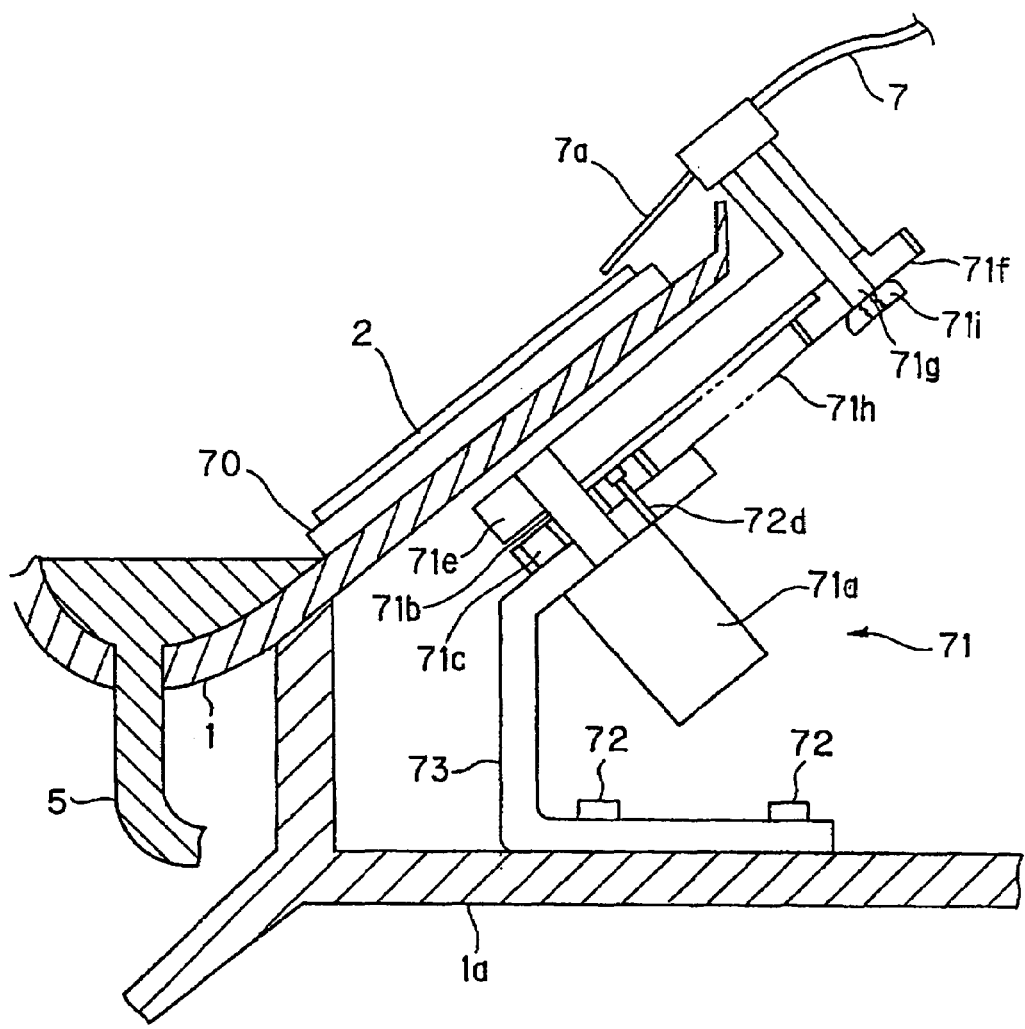
FIG. 14 shows the composition of a microsphere arranging apparatus in a fifth preferred embodiment of the invention.

FIG. 14 shows the composition of a microsphere arranging apparatus in the fifth preferred embodiment of the invention.

The microsphere arranging apparatus as shown in FIG. 14 is different from the microsphere arranging apparatus in FIG. 9 in that, instead of the rotary mounting unit 53, a mount base 70 for the semiconductor device 2 and an oscillating unit 71 to oscillate the microsphere supplying nozzle 7a are built in the transfer bath 1. In FIG. 14, the pump 11, storage container 6, washing pipe 8 and washing nozzle 8a are omitted. Hereinafter, the omitted components are explained with reference to FIG. 9.

The mount base 70 is attached, in parallel, to the inclined face of transfer bath 1. When the semiconductor device 2 is mounted thereon, the semiconductor device 2 is inclined securely.

The oscillating unit 71 is composed of: a motor 71a that is attached to a support member 73 fixed to a support portion 1a of transfer bath 1 through screws 72; a rotating shaft 71b of the motor 71a; a first timing pulley 71c; a nozzle oscillating lever 71e with one end L-shaped; a second timing pulley 71f; a nozzle attaching shaft 71g; and a timing belt 71h.

The first timing pulley 71c is attached through a screw 72d to the support member 73 while having the rotating shaft 71b inserted through its penetrating hole. Thus, the first timing pulley 71c is attached to the support member 73 so as not to prevent the rotation of the rotating shaft 71b.

The end of the rotating shaft 71b is securely fixed to the end of the nozzle oscillating lever 71e. The lever 71e has a penetrating hole formed at its L-shaped edge, and the nozzle attaching shaft 71g is rotatably inserted through the penetrating hole. The nozzle attaching shaft 71g has a microsphere supplying nozzle 7a attached at its top end. The second timing pulley 71f is attached to the lower end of the nozzle attaching shaft 71g projecting a predetermined length from the L-shaped edge, and secured thereto by a nut 71i. Namely, the microsphere supplying nozzle 7a and the second timing pulley 71f are fixed to the nozzle attaching shaft 71g, but the nozzle attaching shaft 71g is rotatably attached to the L-shaped edge of nozzle oscillating lever 71e.

The first timing pulley 71c and the second timing pulley 71f are connected through the timing belt 71h.

Figure 15:
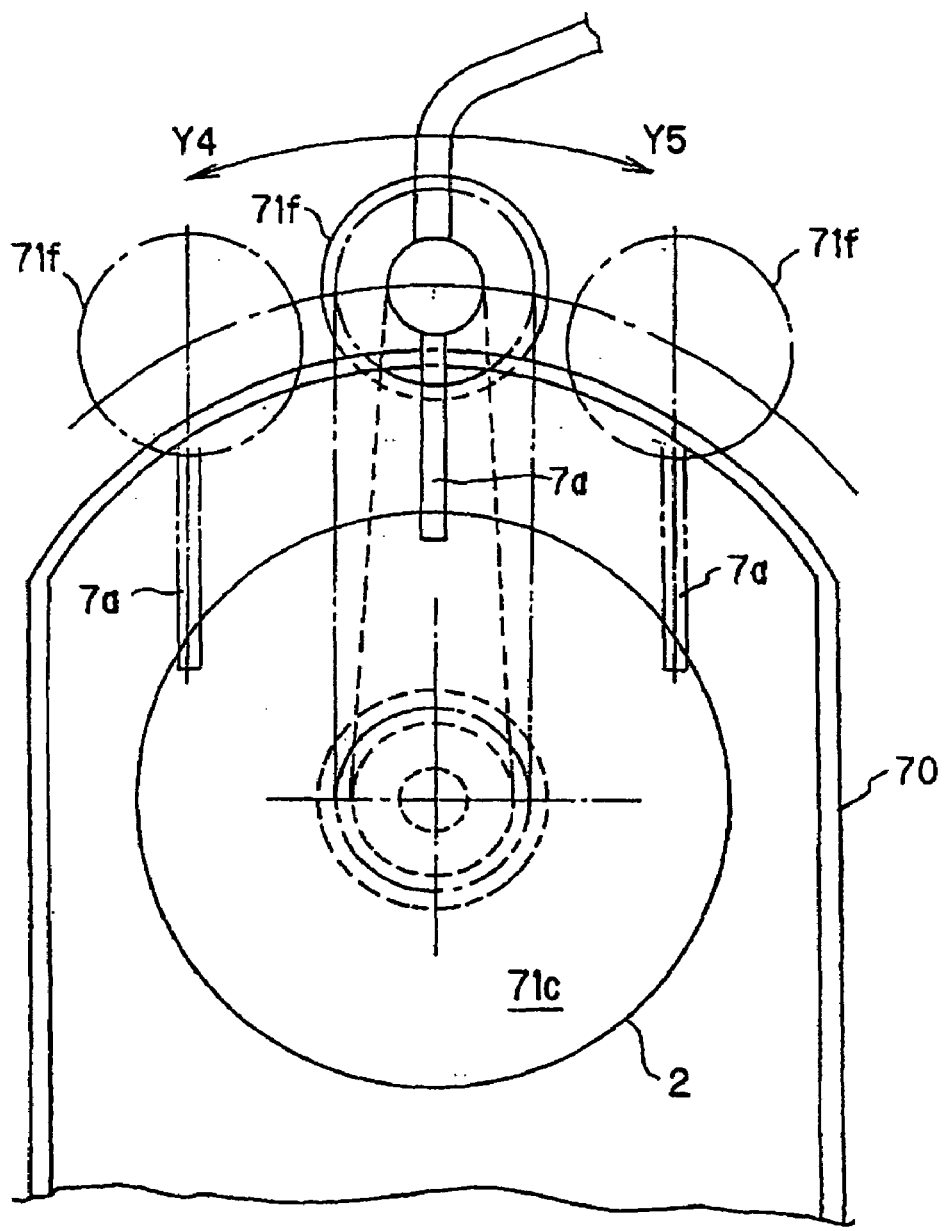
FIG. 15 illustrates the operation of the microsphere arranging apparatus in the fifth embodiment of the invention.

The rotating shaft 71b of motor 71a oscillates at predetermined rotation angles. As shown in FIG. 15, the microsphere supplying nozzle 7a, in an arc, oscillates, from one end to the other end of semiconductor device 2 in the direction illustrated by arrows Y4, Y5.

In this case, when the nozzle oscillating lever 71e is rotated in a direction shown by the arrow Y4 together with the rotating shaft 71b, the second timing pulley 71f, that is connected through the timing belt 71h to the first timing pulley 71c fixed to the support member 73, is rotated in the reverse direction to the rotating shaft 71b but with the same angle. Thereby, the microsphere supplying nozzle 7a attached to the second timing pulley 71f through the nozzle attaching shaft and 71g is shifted but always still faces downward without having its direction changed. Although the microsphere supplying nozzle 7a is shifted as described above, the washing nozzle 8a is shifted likewise because the washing nozzle 8a is also attached to the nozzle attaching shaft 71g. Meanwhile, the washing nozzle 8a is omitted from the figures.

Next, the process of arranging microspheres 47 into the arrangement holes 44 of semiconductor device 2 will be explained, where the method of arranging microspheres 47 with liquid using the microsphere arranging apparatus previously described is applied.

At first, the semiconductor device 2 is mounted on the mount base 70 that is included and disposed inside (at the in-air position of) the transfer bath 1.

The washing nozzle 8a is shifted such that it is located over the semiconductor device 2 mounted on the mount base 70. At that time, since the pump 11 stops, the storage container 6 is vacant and therefore the conductive liquid does not flow out of the nozzles 7a and 8a.

Then, the nozzles 7a and 8a are oscillated by driving the motor 71a. Further, by operating the pump 11 at a low speed, conductive liquid retained in the transfer bath 1 and the flexible circulation pipe 5 is supplied to the storage container 6. Then, conductive liquid is ejected from the oscillated washing nozzle 8a through the washing pipe 8, and is flown down from one end to the other end of the semiconductor device 2. Thereby, conductive liquid enters the respective holes 44 while moving from one end to the other end of the semiconductor device 2, further passing through a relief groove (not shown) and then falling into the transfer bath 1. Thereby, gas in the hole 44 is removed. When the time needed to wash the semiconductor device 2 elapses, the washing nozzle 8a is retracted or closed at its ejection port.

Then, by operating the pump 11 at a high speed, the microspheres 47 retained in the transfer bath 1 and circulation pipe 5 are supplied to the storage container 6 together with conductive liquid. Thereby, the microspheres 47 and conductive liquid are ejected through the ejection pipe 7 from the oscillated microsphere supplying nozzle 7a, and flow down from one end to the other end of the semiconductor device 2. Thereby, one of the microspheres 47 enters the hole 44 while being moved from one end to the other end of the semiconductor device 2, and the rest of microspheres 47 and conductive liquid drains into the transfer bath 1.

The microspheres 47 and conductive liquid which have fallen into the transfer bath 1, are transported, through the circulation pipe 5 connected to the lowest portion of the transfer bath 1, to the storage container 6 by the operation of pump 11. After a period of ejection, the pump 11 is switched into the low speed operation. Thereby, the microspheres 47 are retained at part of the circulation pipe 5 being connected to the lowest portion of the transfer bath 1 and at the bottom of transfer bath 1, and only the conductive liquid is transported to the storage container 6.

Then, the washing process is conducted by using the washing nozzle 8a. By the washing process, excessive microspheres 47 being stacked in the hole 44 with one of the microspheres 47 already accommodated therein or being left on the surface of semiconductor device 2 can be removed, and the excessive microspheres 47 can be accommodated in another hole 44 with no microsphere accommodated therein.

After a certain time of washing, the pump 11 stops operating. Thereby, the microspheres 47 and conductive liquid, which have fallen into the transfer bath 1 are retained at part of the circulation pipe 5 being connected to the transfer bath 1 and at the bottom of transfer bath 1, and the transportation of conductive liquid to the storage container 6 is stopped. At the time of stopping, conductive liquid left in the storage container 6 falls through the nozzles 7a and 8a and thereby the storage container 6 becomes vacant. Finally, the semiconductor device 2 with the microspheres 47 arranged thereon is released from the mount base 70.

By repeating such operations, the microspheres 47 can be stably arranged while recycling the microspheres 47 and conductive liquid repeatedly.

Alternatively, by using a microsphere arranging apparatus (not shown) with a similar construction, the microspheres 47 may be, in the conductive liquid, arranged onto the arrangement hole 44 of semiconductor device 2.

In this case, the microspheres 47 and the conductive liquid are ejected from the microsphere supplying nozzle 7a, and flow down from one end to the other end of the semiconductor device 2. One of the microspheres 47 may be accommodated in the hole 44.

As described above, the microsphere arranging apparatus and the method of arranging microspheres with liquid in the fifth embodiment is composed such that the semiconductor device 2 consists of: the semiconductor wafer 43 with the predetermined semiconductor element and interconnection and with a number of pads 42 connected to the interconnection and attached on the surface thereof. Additionally, the resist 45 is formed on the semiconductor wafer 43 while having the penetrating holes 44 formed on the respective pads 42 and positioned to mount the microspheres 47. The semiconductor wafer 43 is mounted on the inclined mount base 70, and the microspheres 47 and the conductive liquid are ejected from the microsphere supplying nozzle 7a while oscillating the microsphere supplying nozzle 7a from one end to the other end of semiconductor device 2. Thereby, the microspheres 47 are poured into the hole 44 of semiconductor device 2.

Thus, without using the conventional arrangement pallet, the microspheres 47 can be directly mounted on the pad 42 by pouring the microspheres 47 and conductive liquid into the resist hole 44 of semiconductor wafer 43. In this case, one of the microspheres 47 is accommodated in the hole 44 while being moved from one end to the other end of semiconductor device 2 together with conductive liquid. Thus, the microspheres can be efficiently accommodated in the hole 44. Further, the conventional processes of accommodating the microspheres in the arrangement pallet and then transferring them to the resist hole 44 of semiconductor device 2 are not needed. Accordingly, one of the microspheres 47 can be efficiently mounted on the pad 42. Further, even when the semiconductor device 2 is washed, the washing effect can be enhanced since the conductive liquid flows down the semiconductor device 2 while being oscillated from one end to the other end of semiconductor device 2.

Figure 16:
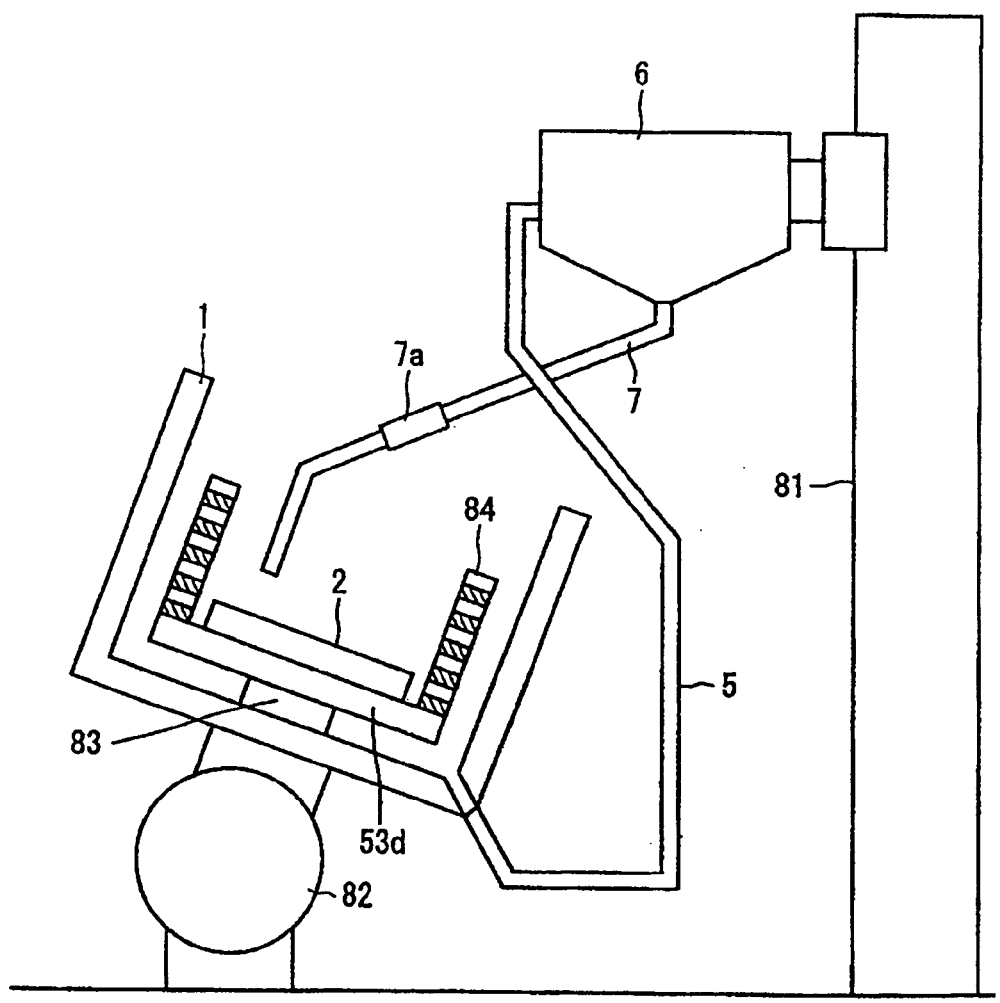
FIG. 16 shows the composition of a microsphere arranging apparatus in a sixth preferred embodiment of the invention.

FIG. 16 shows the composition of a microsphere arranging apparatus in the sixth preferred embodiment of the invention.

A liquid flow-down type arrangement method to arrange the microspheres 47 onto the semiconductor device 2 by using the microsphere arranging apparatus in the sixth embodiment as shown in FIG. 16 will be explained below. The storage container 6 can be moved upward and downward by a storage container vertical movement means 81. The storage container 6 is lifted by operating the storage container vertical movement means 81 such that the storage container 6 becomes higher than the transfer bath 1. At that time, the microspheres 47 and conductive liquid accommodated in the storage container 6 are ejected from the microsphere supplying nozzle 9 through the ejection pipe 7, and falling on the semiconductor device 2 in the conductive liquid. One of the microspheres 47, which has fallen on the semiconductor device 2 is accommodated in the hole 44 and the rest of microspheres 47 and conductive liquid falls into the semiconductor device 2.

The transfer bath 1 is supported by a support portion 82. The transfer bath 1 and mount base 53d can be angle-controlled by the support portion 82. When the microspheres 47 are transferred into the hole 44 while the microspheres 47 and conductive liquid flow down onto the semiconductor device 2 mounted on the mount base 53d, the transfer bath 1 is preferably controlled to have a suitable angle.

Further, the mount base 53d can be rotated by a rotating means 83. The semiconductor device 2 can be rotated at a suitable speed when one of the microspheres 47 is transferred into the hole 44 while the microspheres 47 and conductive liquid flow down onto the semiconductor device 2 mounted on the mount base 53d. Thereby, the microspheres 47 can be efficiently transferred into the hole 44 and excessive microspheres 47 can fall onto the bottom of transfer bath 1.

In the case when ethanol is used as the conductive liquid and SnPb eutectic solder balls with a diameter of 100 μm are used as the microspheres, the arrangement can be made more efficient by using a combination of an inclination angle and a rotation speed as shown in FIG. 9. If a suitable angle and rotation speed is used, liquid flow is generated in the conductive liquid retained in the transfer bath 1 due to the rotation of the semiconductor device 2 and mount base 53d. Due to this liquid flow, the microspheres 47 are efficiently moved on the semiconductor device 2. In this case, it is more effective that an agitator 84 be used with the mount base 53d to generate the liquid flow. The agitator may be shaped like a protrusion or a netted plate structure, to surround the semiconductor device 2. The netted structure is preferred since the semiconductor device 2 can be easily taken out.

The microspheres 47 falling on the bottom of transfer bath 1 are retained at part of the circulation pipe 5 connected to the bottom of the transfer bath 1 and at the bottom of the transfer bath 1.

When the storage container 6 descends to a predetermined lower position after the microspheres 47 and conductive liquid accommodated in the storage container 6 are completely ejected into the transfer bath 1, the microspheres 47 and conductive liquid are retained at part of the circulation pipe 5 and at the bottom of the transfer bath 1 and flow through the circulation pipe 5 into the storage container 6.

Figure 17:
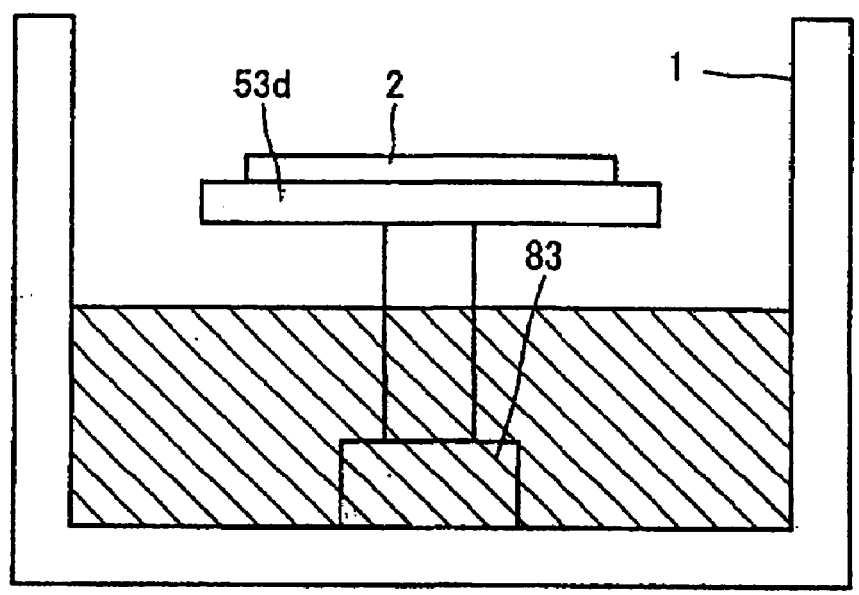
FIG. 17 illustrates the positions of a transfer bath of the microsphere arranging apparatus and of a semiconductor device mounted on the mount base.
Figure 18A:
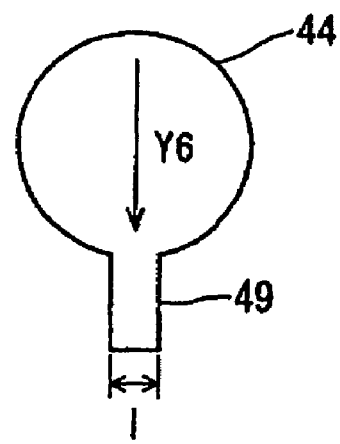
FIGS. 18(a) and 18(b) are plan views showing a relief groove formed in connection with a resist hole.
Figure 18B:
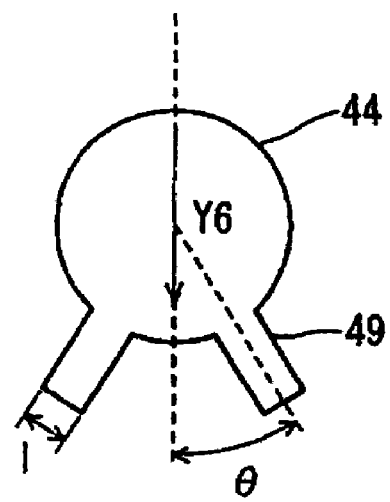
Figure 19A:
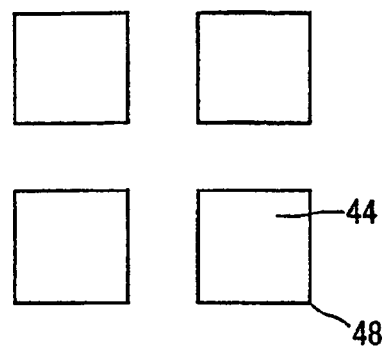
FIGS. 19(a), (b) and (c) are plan views showing the shape of resist holes and a relief groove formed in connection with a resist hole.
Figure 19B:
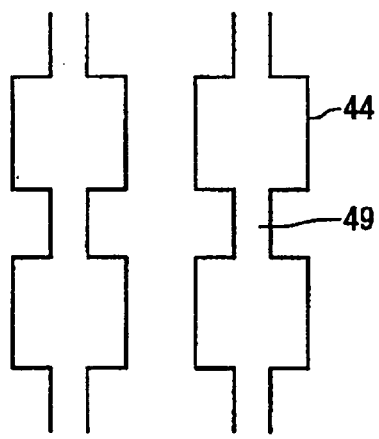
Figure 19C:
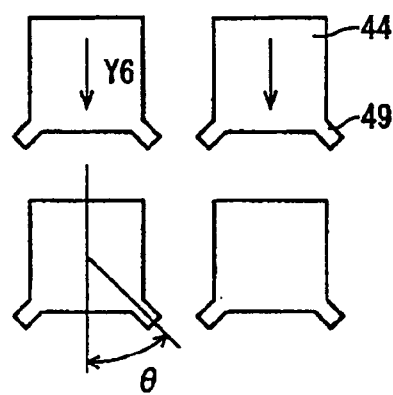

As shown in FIG. 17, mount base 53d and semiconductor device 2 may be placed such that they are not soaked in conductive liquid retained in the transfer bath 1. One of the microspheres 47 then may be transferred into the hole 44 while the microspheres 47 and conductive liquid fall thereon. Further, the mount base 53d and semiconductor device 2 may not be inclined during the transferring.

The microsphere arranging apparatus and the method of arranging microspheres with liquid in the sixth embodiment thus composed can have the same effects as the first embodiment.

Referring to FIGS. 18(a), 18(b) and 18(c), 19(a), 19(b) and 19(c), 20 and 21, various shapes of resist hole will be detailed.

Figure 21:
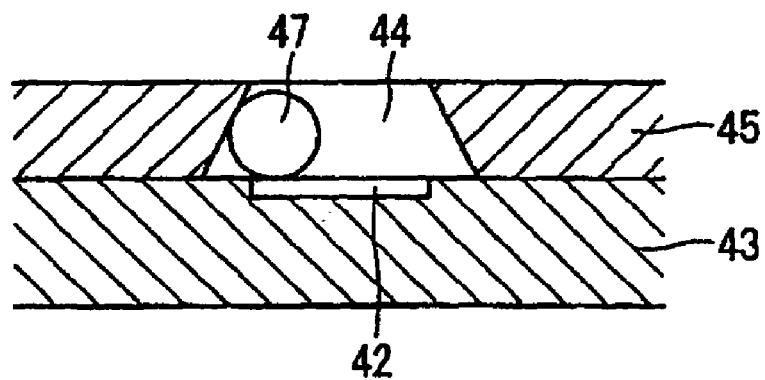
FIG. 21 is a plan view showing a relief groove formed in connection with a resist hole.

FIGS. 18(a), 18(b) and 18(c) and 19(a), 19(b) and 19(c) are plan views showing the shapes of a penetrating hole to mount the microsphere formed in the resist of semiconductor device in the seventh embodiment of the invention. FIG. 21 is a cross sectional view showing a penetrating hole to mount the microsphere formed in the resist of semiconductor device in the seventh embodiment of the invention.

Accommodating the microspheres 47, bathed in the liquid, into the resist hole 44 is difficult because obstructions such as air or gas are present in the microscopic hole 44. Further, the conductive liquid used in the transferring of microspheres 47 becomes unnecessary after one of the microspheres 47 is transferred into the resist hole 44. Therefore, after the transferring is completed, it is preferred that as much as possible of the conductive liquid left on the resist hole 44 and semiconductor device 2 is removed. Thus, a relief groove for gas or liquid needs to be formed connected to the hole 44 as described earlier.

The relief groove can be formed by, for example, etching the resist 45. Further, it can be formed by using the photolithography technique such as exposure and development while using a photosensitive resist. Further, the hole can be formed by using a laser processing machine or a mechanical processing machine. The laser processing machine is preferred because, when an absorption agent, which reacts at the wavelength of laser, is added to the resist material, the processing accuracy can be enhanced and the processing can be conducted without any thermal damage on the surface of semiconductor wafer 43 or pad 42.

When the relief groove 49, as shown in FIG. 18(*a*), is formed in the direction Y6 of liquid flow, gas such as air can easily be removed in flowing conductive liquid. If the relief groove 49 has a greater than width l, the gas or liquid will be easy to remove, but it should not be large enough that microspheres 47 once accommodated in the hole 44 are released. Multiple relief grooves may be provided. If they are, as shown in FIG. 18(*b*), disposed at an angle θ in relation to the direction Y6 of liquid flow, the releasing of microspheres 47 can be prevented. The angle θ may be 0 to 90 degrees and preferably 30 to 60 degrees. Although the above example is illustrated with the relief grooves formed in two directions, they may be formed in three or more directions. The multiple relief grooves 49 may be also formed in one direction.

Further, the resist hole 44 may be rectangular as shown in FIG. 19(*a*). As compared to the circular hole, the efficiency of accommodating microspheres 47 in the hole 44 can be enhanced by flowing the liquid in a certain direction. Also, the gas or liquid can be removed easier since its corner 48 functions as a groove 49. As shown in FIG. 19(*b*), the relief groove 49 may be formed such that neighboring holes 44 are connected. Further, as shown in FIG. 19(*c*), the relief groove 49 may be formed at an angle θ in relation to the direction Y6 of liquid flow. The angle θ may be 0 to 90 degrees and preferably 30 to 60 degrees.

Figure 20:
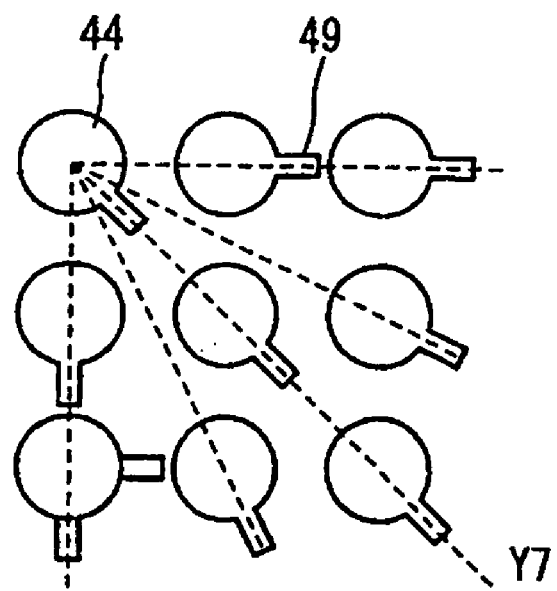
FIG. 20 is a plan view showing a relief groove formed in connection with a resist hole.

If one of the microspheres 47 is accommodated into the resist hole 44 while rotating the mount base 53*d* by the rotating means 83, as described in the sixth embodiment, the direction of liquid flow varies on the semiconductor device 2. Thus, when the liquid flow-down type arrangement method is conducted using the rotating means, the relief groove 49 is desirably formed such that, as shown in FIG. 20, it defines radial directions Y7 to the hole 44.

Although the resist hole 44 may have a wall perpendicular to the surface of semiconductor wafer 43 as shown in FIG. 4, it may be, as shown in FIG. 21, formed tapered such that the semiconductor wafer 43 side is wider than the surface side of resist 45. Thereby, once one of the microspheres 47 accommodated therein can be prevented from being released. Such a form can be made by adjusting the exposure conditions or development or adjusting the exposure focusing when forming the resist hole 44 by using the photolithography technique on the resist. Further, it may be made by laser processing while controlling the angle to irradiate laser light.

The above resist hole and relief groove can be applied to the microsphere arranging apparatus and the method of arranging microspheres with liquid in the first to sixth embodiments. Thereby, the microsphere can be arranged while facilitating the removing of gas or liquid and preventing the microsphere accommodated therein from being released.

Figure 22:
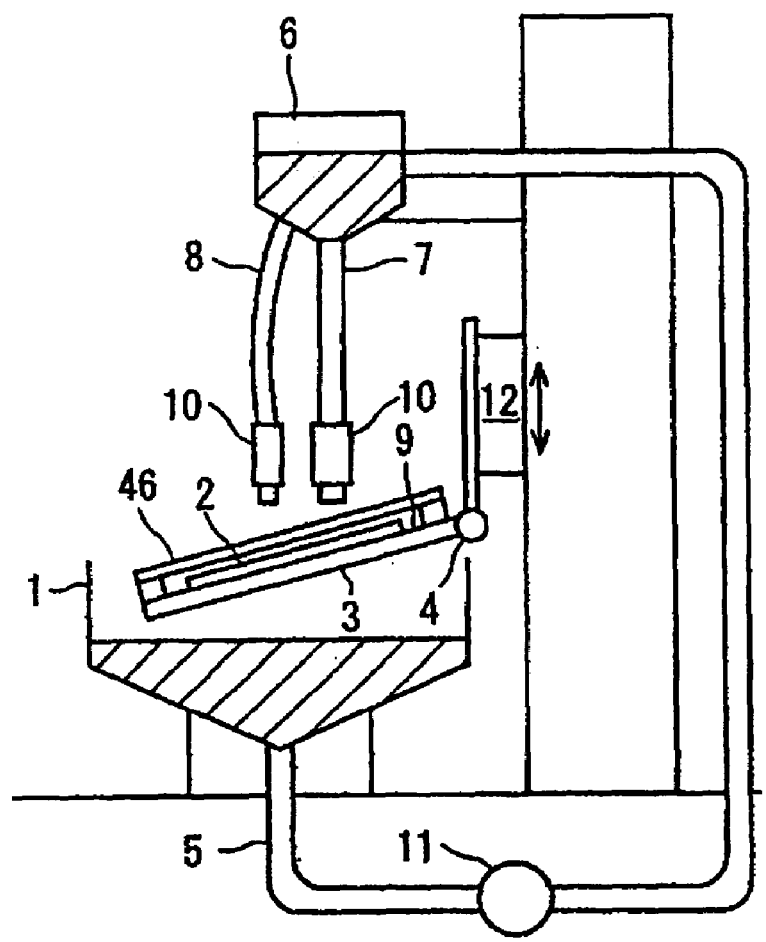
FIG. 22 shows the composition of a microsphere arranging apparatus in an eighth preferred embodiment of the invention.

FIG. 22 shows the composition of a microsphere arranging apparatus in the eighth preferred embodiment of the invention.

The microsphere arranging apparatus as shown in FIG. 22 has the same mechanism as the microsphere arranging apparatus in the first embodiment as shown in FIG. 1. However, the semiconductor device 2 mounted on the mount base 3 does not have the resist 45 with the hole 44 for accommodating the microspheres 47. Instead, a mask 46 is provided. Namely, the semiconductor wafer 43 is mounted on the mount base 3, and the mask 46 with penetrating holes 44 for disposing the microspheres 47 at the position of pad 42 is formed on the semiconductor wafer 43.

Figure 23:
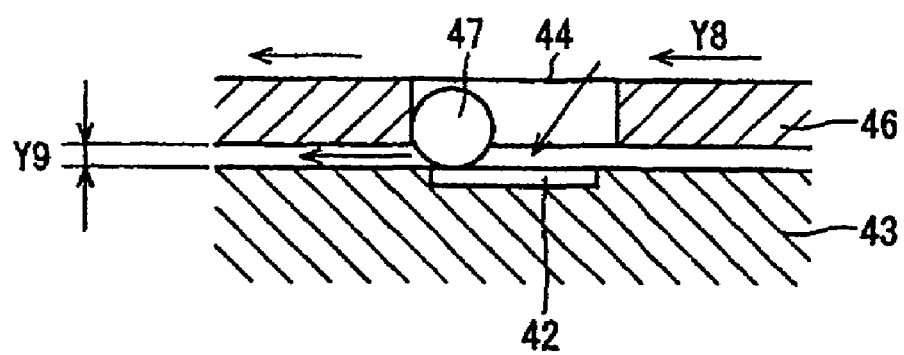
FIG. 23 is a cross sectional view showing a positional relationship among a semiconductor wafer mounted on a mount base of the microsphere arranging apparatus, a pad on the wafer, and a hole formed in a mask to mount a microsphere.

FIG. 23 is a cross sectional view showing a positional relationship among the semiconductor wafer 43 mounted on the mount base, the pad 42 on the semiconductor wafer 43, and the hole 44 formed in the mask 46 to mount the microspheres 47. The mask 46 has a hole 44 to accommodate one of the microspheres 47 just like the resist explained in the first embodiment or the seventh embodiment. The hole 44 is disposed at such a position that one of the microspheres 47 can be mounted on the pad 42. Also, a holding member is provided that defines a relief gap Y9 between the semiconductor wafer 43 and the mask 46. When the conductive liquid flows, gas such as air or liquid can be removed through the relief gap Y9, and therefore the microspheres 47 can be easily accommodated.

The length t of relief gap Y9 preferably satisfies the condition:

$t \leq \frac{1}{2} d_{min}$ where the diameter of microsphere used is d, the accuracy of microsphere diameter d is α microns, therefore the minimum diameter of microsphere $d_{min} = d - \alpha$ and the maximum diameter of microsphere $d_{max} = d + \alpha$.

It is further preferable to satisfy:

$\frac{1}{4} d_{min} \leq t \leq 1/2 d_{min}$

Also, the thickness T of mask 46 preferably satisfies the condition:

$\frac{1}{2} d_{max} < T + t \leq d_{min}$

The mask 46 may be made by etching, laser-processing or mechanically processing a metal plate such as a stainless plate, copper plate and or aluminum plate. It may be made by the electroforming of nickel or copper. Further, a silicon mask is available. For example, the mask 46 may be made of silicon. The mask 46 of silicon is advantageous because a displacement from the pad 42 can be prevented later when forming a bump during the fusing of the microsphere. This is due to the coincidence in thermal expansion coefficient between the semiconductor device 2 and the mask. The mask 46 can be made by a mechanical processing such as laser processing or drilling or by etching. The anisotropic etching is preferred because of its advanced processing. For example, when a square pyramid with (111) orientation is made by conducting the anisotropic etching on a silicon wafer with (100) face on its surface, fine processing can be performed. A penetrating hole can be formed by conducting the anisotropic etching on one side of silicon wafer or by etching both sides thereof. It is preferable to etch both sides in order to control the sectional form of the penetrating hole to prevent the microsphere from being released.

In the case of using a metallic mask 46, a resin material etc. may be coated thereon since the metallic mask may contact the microspheres 47 and thereby cause damage thereto. Also, it may be formed by photolithography using a photosensitive resin. A resin material with photosensitive group such as photosensitive polyimide, photosensitive fluorene resin and photosensitive acrylic resin may be used. A resin with rigidity such as photosensitive acrylic resin is desirable.

Figure 24A:
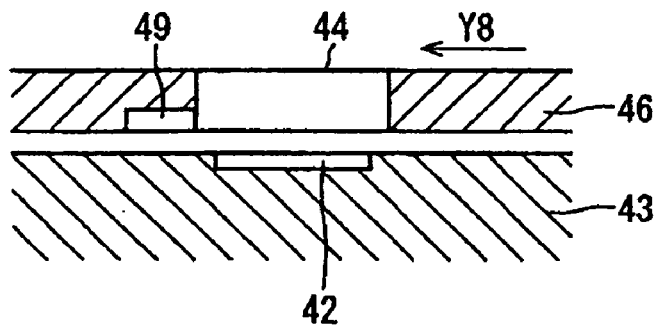
FIGS. 24(a), (b) and (c) are cross sectional views showing a relief groove formed in the mask.
Figure 24B:
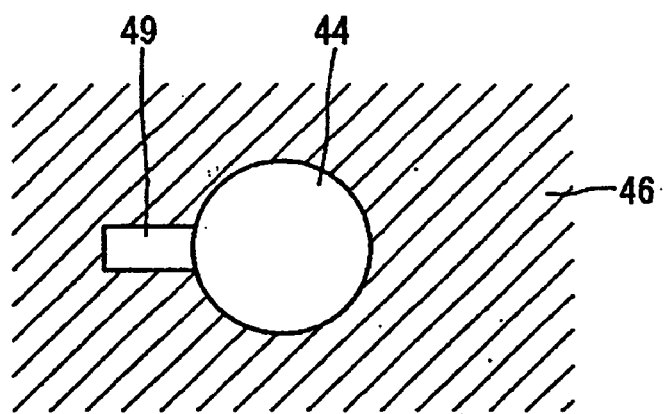

FIGS. 24(*a*), 24(*b*) and 24(*c*) are cross sectional views showing a relief groove formed in the mask. As shown, the relief groove 49 is formed on only the semiconductor wafer 43 side and without penetrating the mask 46. Thereby, the gas or liquid can be removed easily. The mask 46 may be formed by conducting the electroforming in two or more stages. Further, it may be formed by half-etching, laser processing or mechanical processing after a mask is made by the abovementioned method.

Figure 24C:
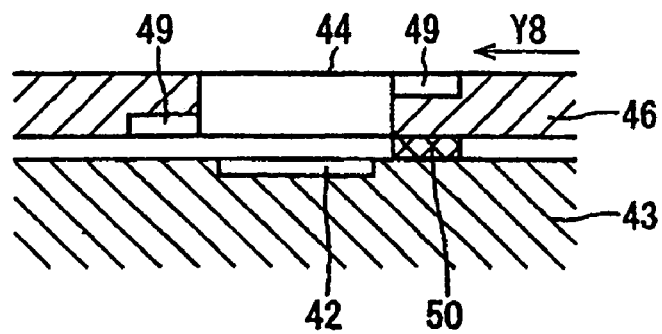

Further, as shown in FIG. 24(c), a bank 50 may be provided upstream of the pad 42 in a direction Y8 of liquid flow. Thereby, the microspheres 47 once accommodated can be prevented from being released.

Further, as shown in FIG. 24(c), a relief groove 49 may be formed upstream of the hole 44 in the direction Y8 of liquid flow and on the surface side of mask 46. Thereby, the microspheres 47 and conductive liquid can be drained smoothly. The hole 44 of mask 46 may be rectangular or tapered like the hole 44 of resist 45 as described earlier.

The microsphere arranging apparatus and the method of arranging microspheres with liquid in the eighth embodiment can have the same effects as the first embodiment.

Figure 25:
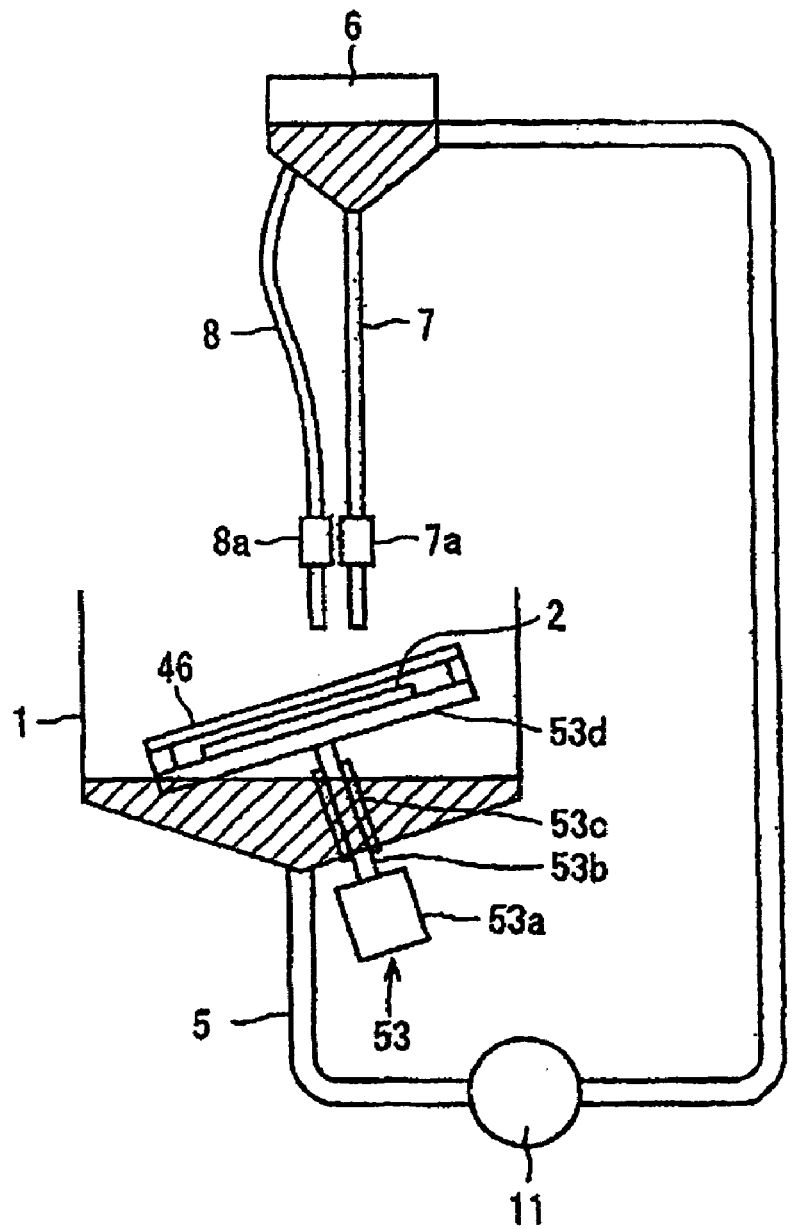
FIG. 25 shows the composition of a microsphere arranging apparatus in a ninth preferred embodiment of the invention.

FIG. 25 shows the composition of a microsphere arranging apparatus in the ninth preferred embodiment of the invention.

The microsphere arranging apparatus as shown in FIG. 25 has the same mechanism as the microsphere arranging apparatus in the third embodiment as shown in FIG. 9. However, the semiconductor device 2 mounted on the mount base 53d does not have the resist 45 with the hole 44 for accommodating the microspheres 47 and, instead, a mask 46 is provided. The composition on the mount base 53d is the same as that in the eighth embodiment as explained with reference to FIGS. 23 and 24.

Therefore, the microsphere arranging apparatus and the method of arranging microspheres with liquid in the ninth embodiment can have the same effects as the above eighth embodiment.

Furthermore, when the mask 46 of the microsphere arranging apparatus in the ninth embodiment is provided on the semiconductor wafer 43 of the microsphere arranging apparatus in the fourth to sixth embodiments, the same effects can be obtained.

In the first to sixth and eighth and ninth embodiments, an oscillating means to oscillate the mount base may be incorporated. Thereby, the microspheres 47 can be more quickly accommodated into the hole 44 of semiconductor device 2, and the operating efficiency can be enhanced and the manufacturing cost can be reduced.

Figure 26:
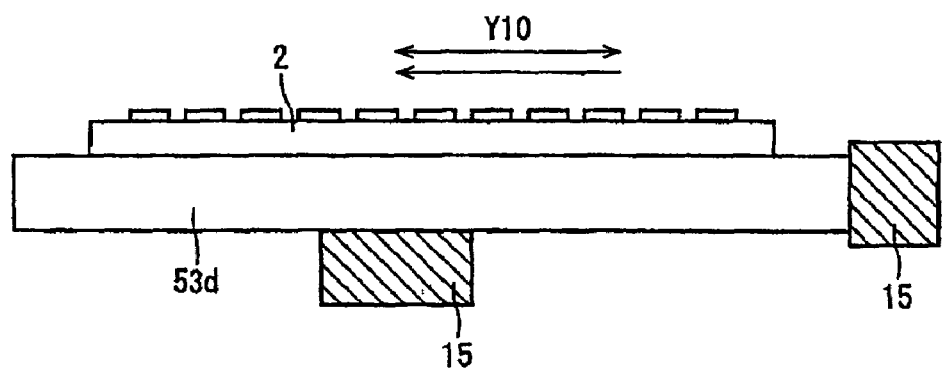
FIG. 26 is a vibrating means (piezoelectric element) attached to a mount base to mount a semiconductor device.

The oscillating means may be, for example, a piezoelectric element provided on the back face as shown in FIG. 26 or side face of the mount base 53d. The oscillation is applied desirably in a horizontal direction Y10 in relation to the semiconductor device 2 because the accommodated microspheres 47 may be released if the oscillation is applied in a vertical direction to the semiconductor device 2. Further, when a traveling wave is generated to which is headed in one direction or multiple directions from the center to the circumference of semiconductor device 2, the microspheres 47 can be more quickly accommodated in the hole 44 of semiconductor device 2. Thereby, the operating efficiency can be enhanced.

In the first to tenth embodiments, the microspheres 47 are solder balls. The solder ball may be a ball consisting of solder, a plastic core covered with solder, a gold ball or a copper ball with silver plating, or various conductive microballs.

Although in all of the above embodiments the semiconductor wafer 43 is circular, it may be rectangular etc. Even in such a case, the same effects can be obtained.

Although the microspheres 47 are supplied into the resist 45 or mask 46 on the semiconductor wafer 43 therein, the semiconductor wafer 43 may be replaced by a wiring board, a semiconductor chip etc. Such a modified embodiment is also included in the technical scope of the invention.

As described above, according to the invention, a method of arranging microspheres with liquid comprises the steps of:

providing a semiconductor device that includes a semiconductor wafer with a predetermined semiconductor element and an interconnection and with a number of pads connected to the interconnection and attached on a surface of the semiconductor wafer, and a resist formed on the semiconductor wafer and having a penetrating hole formed at the respective pad positions to mount the microsphere; and pouring the microsphere into the hole together with conductive liquid to mount the microsphere on the pad.

Further, according to the invention, a method of arranging microspheres with liquid comprises the steps of:

providing a semiconductor device that includes a semiconductor wafer with a predetermined semiconductor element and an interconnection and with a number of pads connected to the interconnection and attached on a surface of the semiconductor wafer, and a mask with a penetrating hole formed at the respective pad positions to mount the microsphere, the mask being held on the semiconductor device to allow the hole to be disposed on the pad; and pouring the microsphere into the hole together with conductive liquid to mount the microsphere on the pad.

Thereby, without using the conventional arrangement pallet, the microsphere can be directly mounted on the pad by pouring the microsphere into the resist hole of semiconductor wafer while transporting it together with the conductive liquid. Accordingly, the conventional processes of accommodating the microspheres in the arrangement pallet and then transferring them to the resist hole of semiconductor device are not needed. Therefore, the manufacturing cost can be reduced and the step of transferring the microsphere to the hole of semiconductor device in the bump electrode forming process can be simplified.

Further, by mounting the semiconductor device on the mounting means whose inclination angle can be varied and by supplying the microsphere together with the conductive liquid stored in the storing means to the semiconductor device, the microsphere can be accommodated in the hole arranged in the semiconductor device or in the hole arranged in the mask mounted on the semiconductor device. The conductive liquid containing the microsphere not accommodated is retained by the retaining means and the conductive liquid containing the microsphere retained is transported to the storing means by the pump means. Therefore, the conductive liquid and microsphere can be recycled without being wasted.

Further, in the above semiconductor device, the resist or the combination of mask and relief gap has a thickness that allows the microsphere to be retained in the hole and prevents the two or more microspheres from being entered therein, and a minimum diameter of the hole to be generated due to a manufacture accuracy of the hole is made to be greater than a value obtained by adding a gap to a maximum diameter of the microsphere, and a maximum diameter of the hole is made to prevent the two or more microspheres from being entered into the one hole and prevent the microsphere from being released from the pad. Therefore, the microsphere can be properly mounted on the pad.

Further, the groove that allows the gas or conductive liquid to be removed without being retained in the hole when accommodating the microsphere in the hole is connected to the hole. Therefore, the microsphere can be smoothly and properly accommodated, and the microsphere can be properly mounted on the pad.

Further, with the semiconductor device that includes a semiconductor wafer with a predetermined semiconductor element and an interconnection and with a number of pads connected to the interconnection and attached on a surface of the semiconductor wafer, and a resist formed on the semiconductor wafer and having a penetrating hole formed at the respective pad positions to mount the microsphere, the microsphere is poured into the hole together with conductive liquid while rotating the semiconductor device to mount the microsphere on the pad. Therefore, the microsphere can be efficiently mounted on the pad of the semiconductor device.

The invention claimed is:

1. A microsphere arranging apparatus, comprising:
a base for mounting a semiconductor device that includes a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere;
a storage container for storing conductive liquid containing a number of microspheres, said storage container supplying microspheres together with the stored conductive liquid to a semiconductor device mounted on the base; and
a retaining device for retaining conductive liquid containing microspheres supplied from the storing container to the semiconductor device.

2. A microsphere arranging apparatus, comprising:
a base for mounting a semiconductor device that includes a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere;
a storage container for storing conductive liquid containing a number of microspheres, said storage container supplying microspheres together with the stored conductive liquid to a semiconductor device mounted on the base;
a retaining device for retaining conductive liquid containing microspheres supplied from the storage container to the semiconductor device;
a tube that connects between the storage container and the retaining device; and
a pump that is built in the tube to transport conductive liquid containing microspheres retained in the retaining device to the storage container.

3. The microsphere arranging apparatus, comprising:
a base for mounting a semiconductor device that includes a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere;
a storage container for storing conductive liquid containing a number of microspheres, said storage container supplying microspheres together with the stored conductive liquid to a semiconductor device mounted on the base;
a retaining device, for retaining conductive liquid containing microspheres supplied from the storage container to the semiconductor device;
a tube that connects between the storage container and the retaining device; and
a pump that is built in the tube to transport conductive liquid containing microspheres retained in the retaining device to the storage container wherein:
the pump comprises a base, a rotating body and a plurality of rollers that are rotatably attached to the circumference of the rotating body;
the tube is a flexible tube disposed between the roller and the base; and
a clearance between the roller and the tube disposed is provided so as to have a gap that allows microspheres contained in the conductive liquid to pass through inside the tube while having its original shape when the tube is pressed by the rotation of the roller.

4. A microsphere arranging apparatus, comprising:
a base for mounting a semiconductor device that includes a semiconductor wafer with a predetermined semiconductor element and an interconnection and with a number of pads connected the interconnection and attached on a surface of the semiconductor wafer, and for holding a mask with a penetrating hole formed at the respective pad positions to mount the microsphere so as to allow the hole to be disposed on the pad;
a storage container for storing conductive liquid containing a number of microspheres, said storage container supplying the microspheres together with the stored conductive liquid through the mask to a semiconductor device mounted on the base; and
a retaining device for retaining conductive liquid containing microspheres supplied from the storage container to the semiconductor device.

5. A microsphere arranging apparatus, comprising:
a base for mounting a semiconductor device that includes a semiconductor wafer with a predetermined semiconductor element and an interconnection and with a number of pads connected the interconnection and attached on a surface of the semiconductor wafer, and for holding a mask with a penetrating hole formed at the respective pad positions to mount the microspheres so as to allow the hole to be disposed on the pad;
a storage container for storing conductive liquid containing a number of microspheres, said storage container supplying microspheres together with the stored conductive liquid through the mask to the semiconductor device mounted on the base;
a retaining device for retaining conductive liquid containing microspheres supplied from the storage container to the semiconductor device;
a tube that connects between the storage container and the retaining device; and
a pump that is built in the tube to transport conductive liquid containing microspheres being retained in the retaining device to the storage container.

6. A microsphere arranging apparatus, comprising:
a base for mounting a semiconductor device that includes a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere;

a storage container for storing conductive liquid containing a number of microspheres and for supplying microspheres together with the stored conductive liquid to the semiconductor device mounted on the base;

a retaining device for retaining conductive liquid containing microspheres supplied from the storage container to the semiconductor device;

a tube that connects between the storage container and the retaining device; and a lift that allows the storage container to move to a position above or below the retaining device.

7. A microsphere arranging apparatus, comprising:

a base for mounting a semiconductor device that includes a semiconductor wafer with a predetermined semiconductor element and an interconnection and with a number of pads connected the interconnection and attached on a surface of the semiconductor wafer, and for holding a mask with a penetrating hole formed at the respective pad positions to mount the microsphere so as to allow the hole to be disposed on the pad.

8. A microsphere arranging apparatus, comprising:

a mounting-rotating base for mounting a semiconductor device and for rotating the semiconductor device mounted, the semiconductor device including a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere, a storage container for storing conductive liquid containing a number of microspheres and for supplying the microspheres together with the stored conductive liquid to the semiconductor device mounted on the mounting-rotating base; and a retaining device for retaining conductive liquid containing microspheres supplied from the storage container to the semiconductor device.

9. A microsphere arranging apparatus, comprising:

a base for mounting a semiconductor device while disposing the semiconductor device to be inclined, the semiconductor device including a semiconductor wafer with a predetermined semiconductor element and an interconnection and with a number of pads connected the interconnection and attached on a surface of the semiconductor wafer, and a resist formed on the semiconductor wafer and having a penetrating hole formed at the respective pad positions to mount the microsphere;

a storage container for storing conductive liquid containing a number of microspheres;

a first ejection tube for ejecting microspheres together with the conductive liquid;

an oscillator for oscillating the first ejection tube between one end to the other end of the semiconductor device over the semiconductor device inclined; and a retaining device for retaining the conductive liquid containing microspheres ejected from the first ejection tube to the semiconductor device.

10. A microsphere arranging apparatus, comprising:

a mounting-rotating base for mounting a semiconductor device and for rotating the semiconductor device mounted, the semiconductor device including a semiconductor wafer with a predetermined semiconductor element and an interconnection and with a number of pads connected the interconnection and attached on a surface of the semiconductor wafer, and for holding a mask with a penetrating hole formed at the respective pad positions to mount the microsphere so as to allow the hole to be disposed on the pad;

a storage container for storing conductive liquid containing a number of microspheres, said storage container supplying the microspheres together with the stored conductive liquid to the pad on the semiconductor device mounted on the mounting-rotating base; and a retaining device for retaining the conductive liquid containing the microsphere supplied from the storage container to the pad.

11. A microsphere arranging apparatus, comprising:

a base for mounting a semiconductor device while disposing the semiconductor device to be inclined, the semiconductor device including a semiconductor wafer with a predetermined semiconductor element and an interconnection and with a number of pads connected the interconnection and attached on a surface of the semiconductor wafer, and for holding a mask with a penetrating hole formed at the respective: pad positions to mount the microsphere so as to allow the hole to be disposed on the pad;

a storage container for storing conductive liquid containing a number of microspheres;

a first ejection tube for ejecting the microspheres together with the conductive liquid;

an oscillator for oscillating the first ejection tube between one end to the other end of the semiconductor device over the pad of the semiconductor device; and a retaining device for retaining the conductive liquid containing the microsphere ejected from the first ejection tube to the pad.

12. A microsphere arranging apparatus, comprising:

a mounting-rotating base for mounting a semiconductor device and for rotating the semiconductor device mounted, the semiconductor device including a semiconductor wafer with a predetermined semiconductor element and an interconnection and with a number of pads connected the interconnection and attached on a surface of the semiconductor wafer, and for holding a mask with a penetrating hole formed at the respective pad positions to mount the microsphere so as to allow the hole to be disposed on the pad;

a storage container for storing conductive liquid containing a number of microspheres, said storage container supplying the microspheres together with the stored conductive liquid to the pad on the semiconductor device mounted on the mounting-rotating base;

a retaining device for retaining the conductive liquid containing microspheres supplied from the storage container to the pad;

a tube that connects between the storage container and the retaining device; and a lift that allows the storage container to move to a position above or below the retaining device.

* * * * *